(12) United States Patent
Nishiwaki et al.

(10) Patent No.: US 6,512,186 B1
(45) Date of Patent: Jan. 28, 2003

(54) MULTILAYER PRINTED WIRING BOARD HAVING A ROUGHENED INNER CONDUCTOR LAYER AND PRODUCTION METHOD THEREOF

(75) Inventors: Yoko Nishiwaki, Gifu (JP); Kouta Noda, Gifu (JP)

(73) Assignee: Ibiden Co., Ltd., Gifu (JP)

( * ) Notice: Subject to any disclaimer, the term of this patent is extended or adjusted under 35 U.S.C. 154(b) by 0 days.

(21) Appl. No.: 09/719,548

(22) PCT Filed: Jun. 23, 1999

(86) PCT No.: PCT/JP99/03340

§ 371 (c)(1),
(2), (4) Date: Dec. 22, 2000

(87) PCT Pub. No.: WO00/01209

PCT Pub. Date: Jan. 6, 2000

(30) Foreign Application Priority Data

Jun. 26, 1998 (JP) ............................................ 10-181020
Jun. 26, 1998 (JP) ............................................ 10-181021

(51) Int. Cl.⁷ ............................ H01R 12/04; H05K 1/11
(52) U.S. Cl. ...................... 174/261; 174/255; 174/262; 29/846
(58) Field of Search ........................ 174/250, 261–266, 174/255, 254; 361/777–779, 784–795; 29/846–853; 428/209, 901

(56) References Cited

U.S. PATENT DOCUMENTS

| | | | | |
|---|---|---|---|---|
| 5,597,983 A | * | 1/1997 | Nguyen et al. | 174/264 |
| 5,827,604 A | * | 10/1998 | Uno et al. | 428/209 |
| 6,217,987 B1 | * | 4/2001 | Ono et al. | 428/209 |
| 2001/0037896 A1 | * | 11/2001 | Asai et al. | 174/255 |

FOREIGN PATENT DOCUMENTS

| | | |
|---|---|---|
| JP | 57-97970 | 6/1982 |
| JP | 4-55555 | 5/1988 |
| JP | 2-296392 | 12/1990 |
| JP | 4-99088 | 3/1992 |
| JP | 6-275959 | 9/1994 |
| JP | 10-51113 | 2/1998 |
| JP | 10-98271 | 4/1998 |

OTHER PUBLICATIONS

English Laguage Abstract of JP 10–98271.
English Laguage Abstract of JP 6–275959.
English Laguage Abstract of JP 2–296392.
English Laguage Abstract of JP 57–97970.
English Laguage Abstract of JP 4–99088.
English Laguage Abstract of JP 10–5113.
English Laguage Abstract of JP 4–55555.
Ibonai et al., "Tackifier Utilizing Note", pp. 22–45 (1991).

* cited by examiner

Primary Examiner—Kamand Cuneo
Assistant Examiner—Jeremy Norris
(74) Attorney, Agent, or Firm—Greenblum & Bernstein, P.L.C.

(57) ABSTRACT

A multilayer printed wiring board has such a structure that conductor circuit patterns are formed on a core substrate through interlaminar resin insulating layers and through-holes are formed in the core substrate and a filler is filled in the through-hole. The interlaminar resin insulating layer formed on the substrate is flat and the same kind of roughened layer is formed on the conductor circuit pattern on the substrate over a full surface including a side surface thereof. A cover plated layer is formed just above the through-hole, and the roughened layers are formed on the conductor layer and the conductor circuit pattern located at the same level as the conductor layer over a full surface including side surfaces thereof, and the interlaminar resin insulating layer is formed so as to cover the surfaces of these roughened layers and filled in recess portions between the conductors and flattened on its surface. Thus, it is excellent in the crack resistance under heat cycle condition or the like and does not cause the damage of the cover plated layer.

10 Claims, 13 Drawing Sheets

MULTILAYER PRINTED WIRING BOARD HAVING A ROUGHENED INNER CONDUCTOR LAYER AND PRODUCTION METHOD THEREOF

TECHNICAL FIELD

This invention relates to a multilayer printed wiring board and a method of producing the same, and proposes a multilayer printed wiring board having an excellent resistance to heat cycle and suitable for high densification of interconnecting and through-holes.

BACKGROUND ART

Recently, so-called build-up multilayer wiring board is noticed from a demand for high densification of a multilayer wiring board. This build-up multilayer wiring board is produced by a method as disclosed, for example, in JP-B-4-55555. That is, an insulating material made from a photosensitive adhesive for electroless plating is applied onto a core substrate, dried and developed by light exposure to form an interlaminar insulating layer having openings for via-holes, and then the surface of the interlaminar insulating layer is roughened with an oxidizing agent or the like, and a plating resist is formed on the roughened surface, and portions not forming the resist are subjected to an electroless plating to form via-holes and conductor circuit patterns, and these steps are repeated plural times to obtain a multilayered build-up wiring board.

In such a multilayer printed wiring board, through-holes are formed in the core substrate to connect upper and lower conductor layers to each other, whereby further multilayer formation can be attempted.

In this type of the multilayer printed wiring board having the through-holes in the core substrate, as shown in FIG. 1, a conductor circuit pattern including through-holes is first formed on a core substrate, and then a roughened layer is formed on a surface of the conductor including an inner wall surface of each through-hole by oxidation-reduction treatment, and thereafter a resin filler is filled in each through-hole and between the conductor circuit patterns, and then the surface of the substrate is flattened by polishing and subjected to a rough plating such as interplate (alloy plating composed of copper-nickel-phosphorus, sold by Ebara Yujirite Co., Ltd.) to form an interlaminar resin insulating layer thereon.

In the multilayer printed wiring board produced by this method, however, the roughened layer on the upper surface of the conductor layer is an alloy-plated layer through the interplate plating, while the roughened layer on the side surface of the conductor circuit pattern is a graphitization-reduction treated layer, thus, the interlaminar resin insulating layer joined to the conductor through such a roughened layer has a problem that cracks are created by heat cycle test or the like because of the difference in formation of the roughened layers.

And also, in the multilayer printed wiring board having the through-holes formed in the core substrate, the through-hole itself is a dead space, so that the high densification of the interconnecting is considerably obstructed. Further, the connection of the through-hole to the via-hole is carried out by providing a pad for the connection of the via-hole onto a land portion of the through-hole, so that the pitch of the through-hole can not be made small due to the presence of the pad and hence there is a problem that the high densification of the through-hole is considerably obstructed.

In order to increase the forming density of the interconnection and through-hole, the applicant has previously proposed a multilayer printed wiring board having such a structure that conductor circuit patterns are formed on a substrate through an interlaminar resin insulating layer and through-holes are formed in the substrate and a filler is filled in each through-hole, wherein a conductor layer covering a surface of the filler exposed from the through-hole is formed just above the through-hole and via-holes are formed so as to be connected to the conductor layer.

In such a proposed multilayer printed wiring board, as shown in FIG. 2, through-holes are first formed in a core substrate and roughened by oxidation-reduction treatment, and thereafter a filler is filled in each through-hole and flattened, and subjected to a plating (cover plating) and etched to form a conductor layer covering a surface of the filler exposed from the through-hole (hereinafter referred to as a "cover plated layer" simply) and a conductor circuit pattern, and further roughened layers are formed on these conductor surfaces by oxidation-reduction treatment or the like and a filler is filled in a recess portion between the conductors and the protruded surface of the filler is flattened by polishing and then subjected to a rough plating such as interplate (alloy plating composed of copper-nickel-phosphorus, sold by Ebara Yujirite Co., Ltd.) to form an interlaminar resin insulating layer thereon.

Even in the multilayer printed wiring board produced by this method, however, the roughened layer on the surface of the conductor circuit pattern is an alloy plated roughened layer through the interplate and the roughened layer facing to the side of the conductor circuit pattern is a graphitization reduction treated layer, so that the interlaminar resin insulating layer connected to the conductors through these roughened layers has a problem of creating cracks by heat cycle test or the like, due to the difference in formation of these roughened layers.

In this method, there is a problem that the cover plated layer is damaged by the polishing treatment for the flattening carried out after the filling of the filler.

The invention is to solve the aforementioned problems of the conventional techniques and to provide a multilayer printed wiring board having an excellent crack resistance under conditions of heat cycle and the like and a method of producing the same.

Another object of the invention is to propose a method of producing the multilayer printed wiring board capable of realizing high densification of interconnection and through-hole without damaging the cover plated layer.

DISCLOSURE OF INVENTION

The inventors have made various studies in order to achieve the above objects and as a result the invention comprising the following constituents has been accomplished.

(1) That is, the invention lies in a multilayer printed wiring board having a structure that outer conductor circuit patterns are formed on a core substrate having inner conductor circuit patterns formed thereon through interlaminar resin insulating layers, and through-holes for electrically connecting the inner conductor patterns to each other are formed in the core substrate, and a filler is filled in the through-hole, characterized in that the interlaminar resin insulating layer is flat and the same kind of roughened layer is formed on the conductor circuit pattern over a full surface including side surfaces thereof.

(2) And also, the invention lies in a multilayer printed wiring board having a structure that outer conductor circuit patterns are formed on a core substrate having inner conductor circuit patterns formed thereon through inter-laminar resin insulating layers, and through-holes for electrically connecting the inner conductor patterns to each other are formed in the core substrate, and a filler is filled in the through-hole, characterized in that a conductor layer covering an exposed surface of each filler from the through-hole is formed just above the through-hole, and the same kind of roughened layer is formed on the conductor layer and the inner conductor circuit pattern located at the same level as the conductor layer over a full surface including side surfaces thereof, and the interlaminar resin insulating layer is formed so as to cover the surfaces of these roughened layers and filled in recess portions between the conductor and inner conductor circuit pattern or between the inner conductor circuit patterns and flattened on its surface.

(3) Further, the invention lies in a method of producing a multilayer printed wiring board having a structure that outer conductor circuit patterns are formed on a core substrate having inner conductor circuit patterns formed thereon through interlaminar resin insulating layers, and through-holes for electrically connecting the inner conductor patterns to each other are formed in the core substrate, and a filler is filled in the through-hole, which comprises at least the following steps (a)~(g):

(a) a step of forming through-holes on a substrate provided on each of both surfaces with a metal layer;
(b) a step of roughening the surface of each metal layer and the inner wall face of each through-hole;
(c) a step of filling a resin in each through-hole;
(d) a step of flattening the rein exposed from the through-hole and the roughened surface of the metal layer by polishing;
(e) a step of etching the metal layer to form inner conductor circuit patterns to thereby form the core substrate;
(f) a step of forming the same kind of roughened layers on a full surface of the inner conductor circuit pattern including side faces thereof; and
(g) a step of forming the resin insulating layer so as to cover the roughened layers and flattening the surface of the resin insulating layer by hot pressing to form an interlaminar resin insulating layer.

(4) Moreover, the invention lies in a method of producing a multilayer printed wiring board having a structure that that outer conductor circuit patterns are formed on a core substrate having inner conductor circuit patterns formed thereon through interlaminar resin insulating layers, and through-holes for electrically connecting the inner conductor patterns to each other are formed in the core substrate, and a filler is filled in the through-hole, which comprises at least the following steps (a)~(g):

(a) a step of forming through-holes in the core substrate;
(b) a step of forming a roughened layer on an inner wall face of each through-hole;
(c) a step of filling a filler in the through-hole;
(d) a step of forming a conductor layer covering an exposed of the filler from the through-hole just above the through-hole;
(e) a step of forming the same kind of roughened layers on a full surface of the conductor layer and the inner conductor circuit pattern located at the same level as the conductor layer including side surfaces thereof;
(f) a step of forming a resin insulating layer so as to cover the roughened layers and flattening the surface of the resin insulating layer by hot pressing to form an inter-laminar resin insulating layer; and
(g) a step of forming outer conductor circuit patterns on the inter-laminar resin insulating layer.

In the production method described in the above item (4), the formation of the roughened layer at the step (b) is favorable to be carried out by oxidation-reduction treatment.

And also, the formation of the roughened layer at the step (e) is favorable to be conducted by the same kind of roughening treatment.

When a photosensitive interlaminar resin insulating layer is formed at the step (f), it is preferable that a transparent film is adhered to the surface of the resin insulating layer prior to the hot pressing and then the surface of the resin insulating layer is flattened through the transparent film by hot pressing and cured by light exposure and thereafter the transparent film is removed to conduct a development treatment.

And also, the hot pressing at the step (f) is favorable to be carried out by pushing a metal plate or a metal roll while heating the resin insulating layer.

Furthermore, in the step (f), the hot pressing of the resin insulating layer composed mainly of epoxy resin is favorable to be carried out under conditions that a temperature is 40~60° C., a pressure is 3.5~6.5 kgf/cm$^2$ and a pressing time is 30~90 seconds.

It is preferable that an opening is formed in a portion of the interlaminar resin insulating layer located just above the through-hole to form outer conductor circuit pattern and via-hole.

Further, it is preferable to use a filler comprising metal particles, a thermosetting or thermoplastic resin and a curing agent as the filler.

BEST MODE FOR CARRYING OUT THE INVENTION

Figure 1:
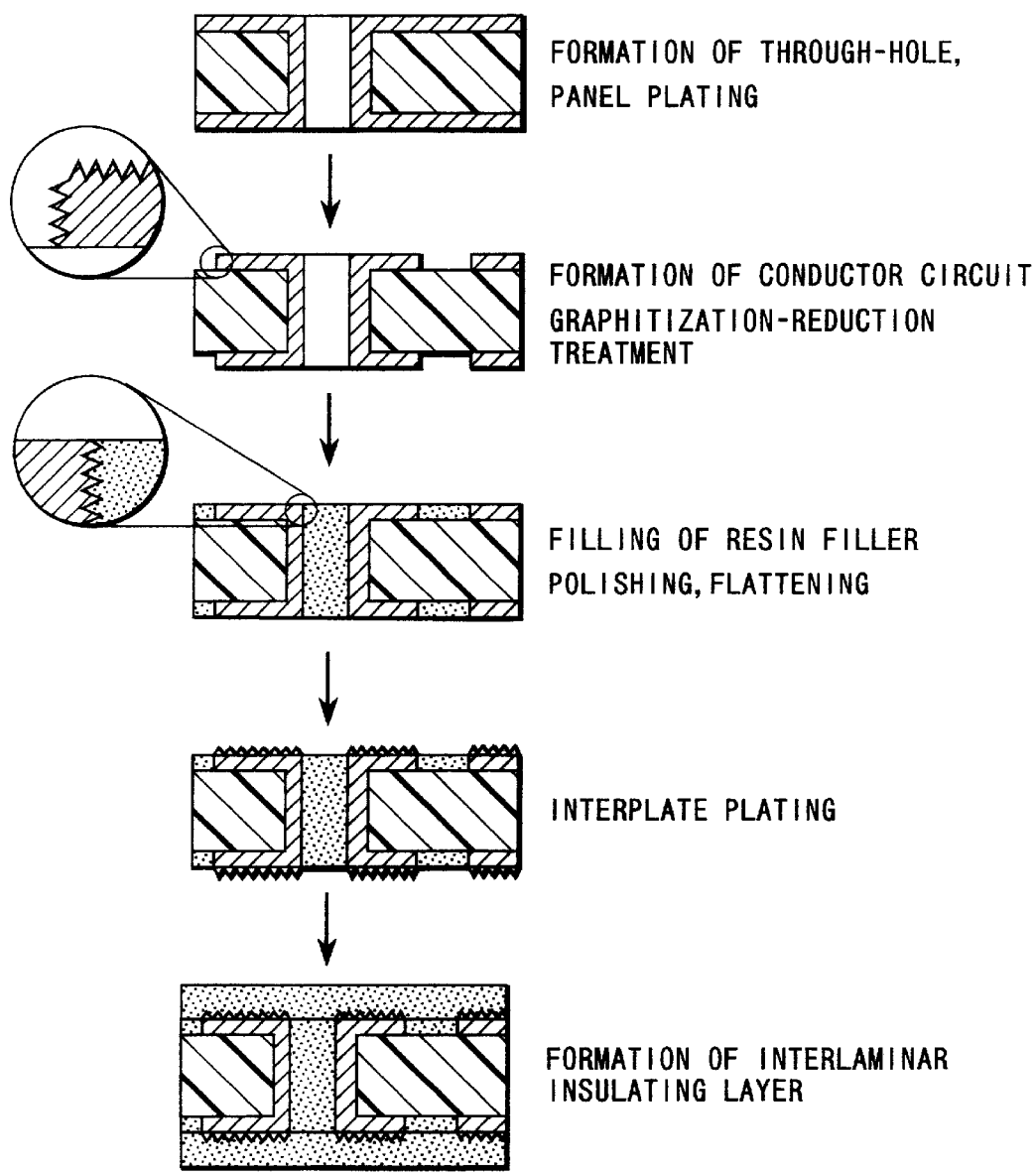
FIG. 1 is an outline illustrating steps of producing a multilayer printed wiring board according to the conventional technique.

A first characteristic of the printed wiring board according to the invention lies in a point that the surface of the interlaminar resin insulating layer on the core substrate is flat and the same kind of the roughened layers are formed on the full surface inclusive of side surface of the inner conductor circuit pattern including through-hole land formed on the core substrate.

That is, the surface of the interlaminar resin insulating layer is flat, and the boundary face between the inner conductor circuit patterns formed on the core substrate and the filler filled in the recess portions between the inner conductor circuit patterns and the boundary face between the inner conductor circuit patterns and the interlaminar resin insulating layer covering the surface of the conductor circuit patterns are constituted by the same kind of the roughening layers.

According to such a construction, the occurrence of crack, due to the difference in the formation of the roughened layers, can be prevented at the boundary face between the (upper) surface side and the lateral surface side of the inner conductor circuit pattern, so that there is not caused poor formation of the opening for the formation of the via-hole through light exposure and development or poor mounting of IC chip or the like.

A second characteristic of the multilayer printed wiring board according to the invention lies in a point that the same kind of the roughened layers are formed on the conductor layer formed just above the through-hole and the inner conductor circuit pattern located at the same level as the conductor layer over full surface including lateral surfaces thereof, and the interlaminar resin insulating layer having a flat surface is formed so as to cover the surface of these roughened layers and fill the recess portion between the conductor and inner conductor circuit pattern or between the inner conductor circuit patterns.

Thus, the occurrence of crack, due to the difference in the formation of roughened layer, can be prevented at the boundary face between the conductor layer and the interlaminar resin insulating layer and the at the boundary face between the conductor circuit pattern located at the same level as the conductor layer and the interlaminar resin insulating layer, and also the interlaminar resin insulating layer can directly be formed on the surface of the substrate having an unevenness by application method or the like without filling the filler in the recess portion between the conductor and inner conductor circuit pattern or between the inner conductor circuit patterns.

In the invention, the roughened layer is formed on the surface of the conductor layer of the inner wall of the through-hole so that the filler and the through-hole are in close contact with each other through the roughened layer to form no gap. If the gap is existent between the filler and the through-hole, the conductor layer formed just thereabove by electroplating becomes not flat, or air in the gap is expanded by heat to cause cracking or peeling, or water retains in the gap to cause migration or cracking. In this connection, the occurrence of the above problems can be prevented by forming the roughened layer.

As the filler in the through-hole, it is desirable to use a resin composition having a thermal expansion coefficient approximately equal to that of the interlaminar resin insulating layer. Because, it is prevented to cause the cracking at the boundary face between the interlaminar resin insulating layer and the filler resulted from the difference of thermal expansion coefficient therebetween.

For example, a resin composition comprising metal particles, a thermosetting or thermoplastic resin and a curing agent is favorable, and may be added with a solvent, if necessary.

As the metal particle, use may be made of copper, gold, silver, aluminum, nickel, titanium, chromium, tin/lead, palladium, platinum and the like. Moreover, the metal particle is preferable to have a particle size of 0.1~50 μm. When it is less than 0.1 μm, copper surface is oxidized to deteriorate the wettability to resin, while when it exceeds 50 μm, the printability is degraded. And also, an amount of the metal particles compounded is favorable to be 30~90 wt % based on total amount. When it is less than 30 wt %, the adhesion property of cover plating is degraded, while when it exceeds 90 wt %, the printability is degraded.

As the resin, use may be made of epoxy resin, phenolic resin, polyimide resin, fluorine resin such as polytetrafluoroethylene (PTFE) or the like, bismaleimide triazine (BT) resin, FEP, PFA, PPS, PEN, PES, nylon, aramid, PEEK, PEKK, PET and so on.

As the curing agent, use may be made of imidazole-based, phenol-based, amine-based curing agent and so on.

As the solvent, use may be made of NMP (normalmethylpyrolidone), DMDG (diethylene glycol dimethyl ether), glycerine, water, 1- or 2- or 3-cyclohexanol, cyclohexanone, methylcellosolve, methylcellosolve acetate, methanol, ethanol, butanol, propanol, bisphenol A-type epoxy and so on.

Furthermore, it is desirable to use the filler containing inorganic ultrafine particles. Because, it can prevent the settlement of the metal particles. As the inorganic ultrafine particle, it is desirable to use silica, alumina, silicon carbide and mullite. Among them, silica is optimum.

An average particle size of the inorganic ultrafine particle is desirable to be 1~1000 nm, preferably 2~100 nm. Since the particle size is very fine, the filling property of the through-hole is not damaged. And also, bond presumed as hydrogen bond can be formed in form of network to entrap the particulate substance.

The amount of the inorganic ultrafine particle compounded is desirable to be 0.1~5 wt % based on the total solid content of the resin composition. Because this range can prevent the settlement of the metal particles without damaging the filling property.

Moreover, the filler is desirable to be non-conductive (specific resistance: not less than 1.48 Ω·cm. In case of the non-conductivity, the shrinkage in curing is small, and the peeling from the conductor layer (cover plated layer) or the via-hole hardly occurs.

A roughened layer is formed on the surface of the conductor layer (cover plated layer) formed so as to cover the exposed surface of the filler in the through-hole and the surface of another conductor circuit pattern located at the same level as the conductor layer.

In the invention, the same kind of the roughened layers are particularly formed on not only the surfaces of the conductor layer and the inner conductor circuit pattern but also the side surfaces thereof, whereby there can be controlled the occurrence of crack vertically created starting from the boundary face between the roughened layer and the interlaminar resin insulating layer toward the interlaminar resin insulating layer due to poor adhesion to the interlaminar resin insulating layer resulted from the difference between the roughened layers.

As the roughened layer, there is a roughened layer by oxidation-reduction treatment, a roughened layer formed by treating with an etching solution of "Mechetchbond" made by Mech Corporation, a plating roughened layer of copper-nickel-phosphorus alloy (e.g. interplate made by Ebara Yugilite Co., Ltd.) or the like.

The roughened layer through the oxidation-reduction treatment is formed by using an aqueous solution of NaOH (20 g/l), $NaClO_2$ (50 g/l) and $Na_3PO_4$ (15.0 g/l) as an oxidation bath and an aqueous solution of NaOH (2.7 g/l) and $NaBH_4$ (1.0 g/l) as a reduction bath.

Particularly, the formation of the roughened layer on the conductor circuit pattern and the conductor layer according to the invention is preferable to be by an etching treatment. The roughened layer can be formed by treating with an aqueous mixed solution of an organic acid and a cupric complex as an etching solution. Such an etching solution can dissolve the copper conductor circuit pattern under oxygen-coexisting condition such as spraying, bubbling or the like.

The reaction is guessed to proceed as follows.

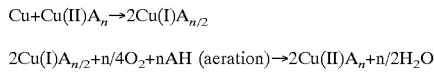

$$2Cu(I)A_{n/2} + n/4 O_2 + nAH \text{ (aeration)} \rightarrow 2Cu(II)A_n + n/2 H_2O$$

wherein A is a complexing agent (acting as a chelating agent) and n is a coordination number.

As shown in the reaction formula, the resulting cuprous complex is dissolved by the action of an acid and bonded with oxygen to form a cupric complex, which again contributes to oxidation of copper. The cupric complex used in the invention is favorable to be cupric complexes of azoles.

This type of the cupric complex acts as an oxidizing agent for oxidizing a metallic copper. As the azole, there are diazoles, triazoles and terazoles. Among them, imidazole, 2-methylimidazole, 2-ethylimidazole, 2-ethyl-4-methylimidazole, 2-phenylimidazole, 2-undecylimidazole and the like are favorable.

The amount of the cupric complex of the azole added is preferably 1~15% by weight. When it is within the above range, the solubility and stability are excellent.

The organic acid is compounded with the cupric complex for dissolving the copper oxide and includes concretely at least one selected from formic acid, acetic acid, propionic acid, butyric acid, valeric acid, capric acid, acrylic acid, crotonic acid, oxalic acid, malonic acid, succinic acid, gultaric acid, maleic acid, benzoic acid, glycolic acid, lactic acid, malic acid, sulfamic acid and the like.

The content of the organic acid is favorably 0.1~30% by weight. In this case, the solubility of the oxidized copper is maintained and the dissolution stability is ensured.

To the etching solution of organic acid-cupric complex may be added a halogen ion such as fluorine ion, chlorine ion, bromine ion or the like for assisting the dissolution of copper and an oxidation action of the azole. The halogen ion can be supplied by adding hydrochloric acid, sodium chloride or the like.

The addition amount of the halogen ion is favorably 0.01~20% by weight. When it is within the above range, the adhesion property of the resulting roughened layer to the solder resist layer is excellent.

The etching solution of organic acid-cupric complex may be prepared by dissolving the cupric complex of azole and organic acid (if necessary, halogen ion) in water.

The etching solution is made from an aqueous solution of 10 parts by weight of imidazole copper (II) complex, 7 parts by weight of glycolic acid and 5 parts by weight of potassium chloride.

As the roughened layer through the plating treatment, there is a copper-nickel-phosphorus alloy layer formed by using an electroless plating bath having a solution composition comprised of an aqueous solution of 1~40 g/l of copper sulfate, 0.1~6.0 g/l of nickel sulfate, 10~20 g/l of citric acid, 10~100 g/l of hypophosphite, 10~40 g/l of boric acid and 0.01~10 g/l of acetylene-containing polyoxyethylene surfactant.

The roughened layer of the alloy plating composed of copper-nickel-phosphorus (e.g. interplate, made by Ebara Yujilite Co., Ltd.) is a needle-like alloy layer. By forming such a roughened layer can be surely improved the adhesion property to the interlaminar resin insulating layer or the via-hole.

After the formation of the above roughened layer, an annealing treatment may be carried out for uniformizing the surface state. Thus, the shape holding property of the roughened layer is improved to maintain the adhesion to the interlaminar resin insulating layer.

The alloy plated rough layer may be covered with a layer of a metal or a noble metal having an ionization tendency larger than copper but smaller than titanium. The metal or noble metal layer can prevent the dissolution of the conductor circuit pattern through local electrode reaction produced when the interlaminar resin insulating layer is roughened after the covering of the roughened layer. The thickness of this layer is 0.1~2.0 μm.

As the metal, there is at least one selected from titanium, aluminum, zinc, iron, indium, thallium, cobalt, nickel, tin, lead and bismuth. As the noble metal, there are gold, silver, platinum and palladium. Among them, tin is particularly favorable. Tin can form a thin layer through an electroless substitution plating and advantageously follow to the roughened layer. In case of tin, there are used a solution of tin borofluoride-thiourea, and a solution of tin chloride-thiourea. The tin layer is formed at about 0.1~2 μm by copper-tin substitution reaction. In case of the noble metal, there can be adopted sputtering method, vapor deposition method and the like.

In the invention, the flattening of the surface of the interlaminar resin insulating layer is carried out by forming the uncured resin insulating layer on the surface of the substrate having an unevenness and then hot pressing with a metal plate or a metal roll.

More preferably, a photosensitive resin insulating layer composed mainly of epoxy resin is applied to the surface of the substrate having the unevenness and a transparent film such as PET film or the like is laminated thereon and pressed at a temperature of 40~60° C. under a pressure of 3.5~6.5 kgf/cm² for a pressing time of 30~90 seconds to flatten the surface.

Thus, the polishing step for flattening the surface of the substrate can be omitted and the problem damaging the cover plated layer can be solved. And also, the incorporation of dust or foreign matter through the polishing can be prevented.

In the invention, there is caused the poor formation of the opening for the formation of the via-hole and the poor mounting including the poor mounting of IC chip or the like resulted from the unevenness of the surface of the interlaminar resin insulating layer. Furthermore, when the transparent film is adhered to the interlaminar resin insulating layer to conduct the curing through light exposure, the obstruction of the curing reaction through oxygen is prevented and as a result, the film reduction can be prevented even in the subsequent development treatment, and also the lowering of peel strength is not caused even when the shallow roughened layer is formed by the roughening treatment.

In the invention, therefore, the roughening treatment of the conductor surface can be carried out at one step without filling the filler in the recess portion between the conductors, so that the number of steps can largely be shortened and the production cost of the multilayer printed wiring board can be decreased.

Figure 2:
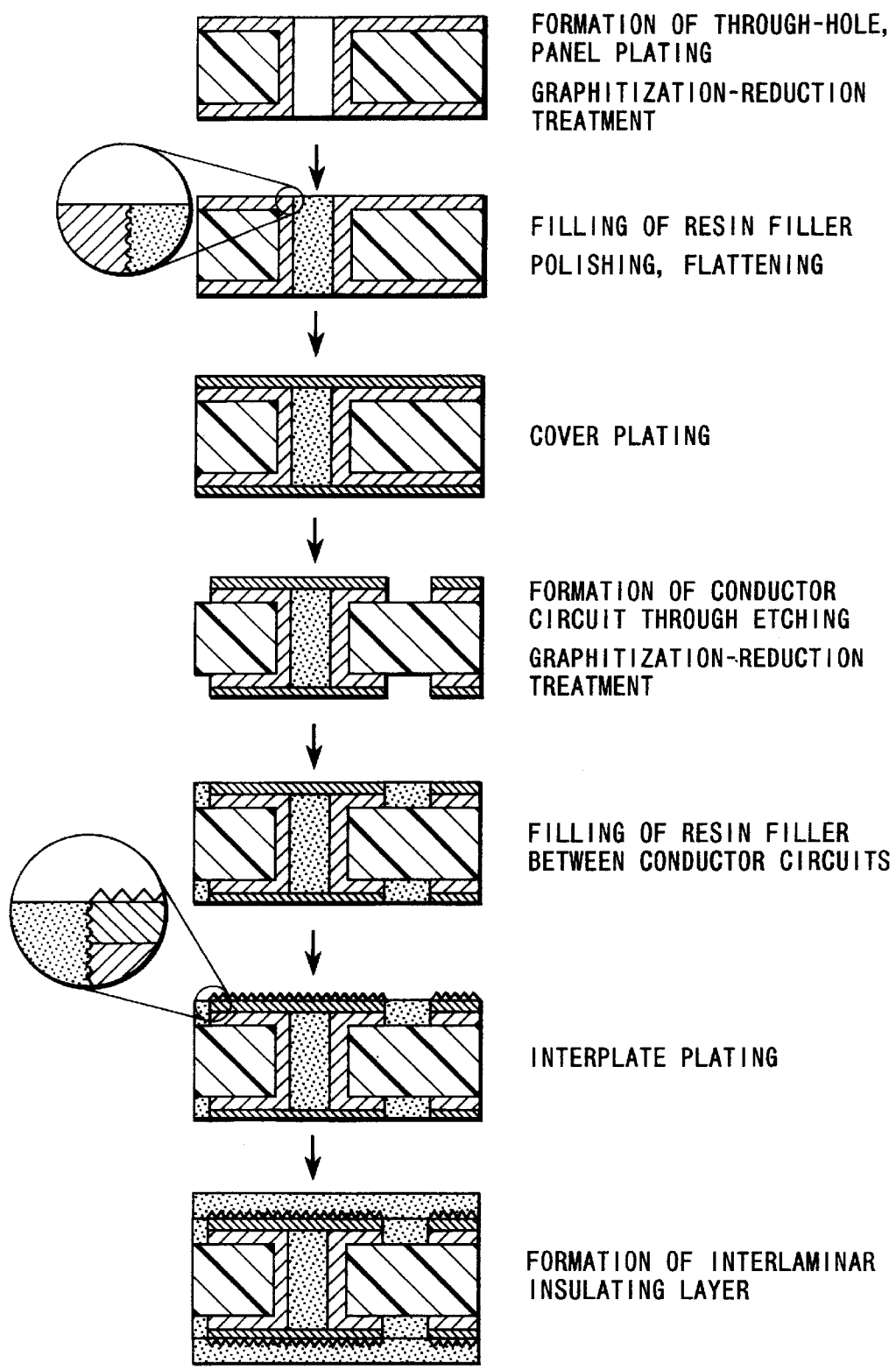
FIG. 2 is an outline illustrating steps of producing a multilayer printed wiring board according to another conventional technique.
Figure 3:
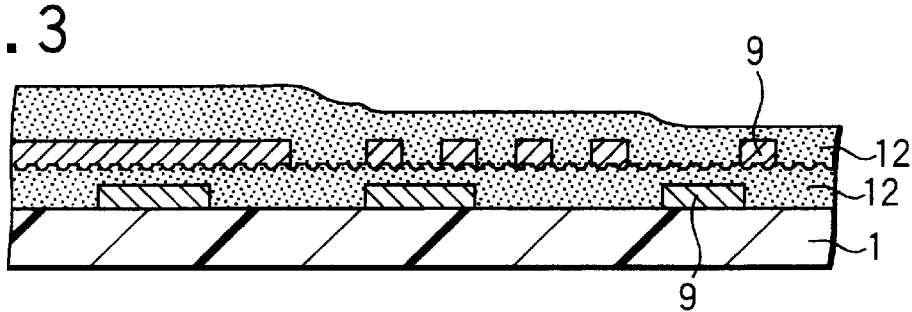
FIG. 3 to FIG. 25 are diagrammatic views illustrating steps of producing a first example of the printed wiring board according to the invention.

The reason why the surface of the resin insulating layer on the substrate is flattened by pressing as mentioned above is as follows. That is, when the uncured resin insulating layer is directly applied to the uneven surface of the substrate, the unevenness is also formed on the surface of the resulting interlaminar resin insulating layer. For example, as shown in FIG. 2, the interlaminar resin insulating layer formed on a wide area region of the conductor circuit pattern is relatively thick in the thickness, while the interlaminar resin insulating layer formed on a narrow area region of the conductor circuit pattern (conductor circuit pattern region) becomes thin in the thickness because the resin insulating agent enters between the patterns. That is, the thickness of the interlaminar resin insulating layer changes in accordance with the surface unevenness of the innerlayer conductor circuit pattern and the unevenness is created on the surface.

Furthermore, the reason why the pressing conditions of the flattening treatment are limited to temperature: 40~60° C., pressure: 3.5~6.5 kgf/cm² and time: 30~90 seconds is as follows. That is, when the press conditions are temperature of lower than 40°, pressure of less than 3.5 kgf/cm² and time of less than 30 seconds, sufficient flatness is not obtained. On the other hand, when the pressing temperature exceeds 60° C., there is a fear of proceeding the curing of the interlaminar resin insulating layer prior to the light exposure and development, and when the pressing pressure exceeds 6.5 kgf/cm², there is a fear of flowing out the interlaminar resin insulating layer from the substrate, and when the pressing time exceeds 90 seconds, there is an anticipation of decreasing the productivity in case of considering the conventional developing time and post baking time.

In the invention, use may be made of a thermosetting resin (including that a part or whole of the thermosetting group is photosensitized), a thermoplastic resin, and a composite of a thermosetting resin (including that a part or whole of the thermosetting group is photosensitized) and a thermoplastic resin as the interlaminar resin insulating layer.

As the thermosetting resin, use may be made of epoxy resin, polyimide resin, phenolic resin, thermosetting polyphenylene ether (PPE) and the like. Particularly, novolac type epoxy resin, alicyclic epoxy resin and the like may be used as the epoxy resin. And also, it is favorable that the photosensitivity is given by substituting a part of the thermosetting group with a photosensitive group. Because, when using the resin insulating agent containing a photosensitized thermosetting resin as a resin component, the opening for the via-hole can easily be formed in the interlaminar resin insulating layer by light exposure and development. When a part or whole of the thermosetting group is photosensitized, a part or whole of the thermo-setting group is acrylated by reacting with methacrylic acid or acrylic acid. Among them, an acrylate of the epoxy resin is optimum.

As the thermoplastic resin, use may be made of a fluorine resin such as polytetrafluoroethylene or the like, polyethylene terephthalate (PET), polysulphone (PSF), polyphenylene sulfide (PPS), thermoplastic polyphenylene ether (PPE), polyether sulphone (PES), polyether imide (PEI), polyphenylene sulphone (PPES), 4-ethylene fluoride-6-propylene fluoride copolymer (FEP), 4-ethylene fluoride perfluoroalkoxy copolymer (PFA), polyethylene naphthalate (PEN), polyether ether ketone (PEEK), polyolefinic resin and the like.

As the composite of thermosetting resin and thermoplastic resin, use may be made of epoxy resin-PES, epoxy resin-PSF, epoxy resin-PPS, epoxy resin-PPES and the like.

In the invention, a glass cloth-impregnated resin composite may be used as the interlaminar resin insulating layer. As the glass cloth-impregnated resin composite, mention may be made of glass cloth-impregnated epoxy resin, glass cloth-impregnated bismaleimide triazine, glass cloth-impregnated PTFE, glass cloth-impregnated PPE, glass cloth-impregnated polyimide and the like.

And also, an adhesive for electroless plating can be used as the interlaminar resin insulating layer.

As the adhesive for electroless plating, there is most preferably used one obtained by dispersing cured heat-resistant resin particles soluble in an acid or oxidizing agent into an uncured heat-resistant resin hardly soluble in an acid or oxidizing agent after the curing treatment. Because, the heat-resistant resin particles are dissolved and removed by treating with the acid or oxidizing agent to form a roughened surface composed of octopus trap-shaped anchors.

In the adhesive for electroless plating, the cured heat-resistant particles are desirable to be particularly at least one selected from ① heat-resistant resin powder having an average particle size of not more than 10 μm, ② aggregated particle of aggregating heat-resistant resin particles having an average particle size of not more than 2 μm, ③ a mixture of heat-resistant resin powder having an average particle size of 2~10 μm and heat-resistant resin particle having an average particle size of not more than 2 μm, ④ false particles obtained by adhering at least one of heat-resistant resin powder and inorganic powder having an average particle size of not more than 2 μm to surfaces of heat-resistant resin powder having an average particle size of 2~10 μm, ⑤ mixture of heat-resistant resin powder having an average particle size of 0.1~0.8 μm and heat-resistant resin powder having an average particle size of more than 0.8 μm but less than 2 μm and ① heat-resistant resin powder having an average particle size of 0.1~1.0 μm. These particles can form anchors of more complicated shape.

As the heat-resistant resin used in the adhesive for electroless plating, use may be made of the above thermo-setting resin, thermoplastic resin and the composite of thermosetting resin and thermoplastic resin.

In the invention, it is desirable that the conductor layer formed just above the through-hole (cover plated layer) is connected to the conductor circuit pattern formed on the interlaminar resin insulating layer through the via-hole. In this case, the via-hole is favorable to be filled with the plated film or the conductive paste.

The production method of the multilayer printed wiring board according to the invention is concretely described with reference to the following embodiment. Moreover, the method mentioned below is concerned with the production method of the multilayer printed wiring board according to the invention through semi-additive method, but full-additive method, multi-lamination method and pin-lamination method may be adopted as the production method of the multilayer printed wiring board according to the invention.

(1) Formation of Through-holes

① Firstly, there is provided a substrate having a metal layer on each of both surfaces, and through-holes are formed by a drill, and an inner wall surface of each through-hole and a surface of the substrate are subjected to an electroless plating and an electrolytic plating.

As the substrate, use may be made of resin substrates such as glass-epoxy resin substrate, polyimide substrate, bismaleimide-triazine substrate and fluorine resin substrate, or a copper clad laminate of such a resin substrate, ceramic substrate, metal substrate and the like. Particularly, in case of considering permittivity, the use of the fluorine resin substrate lined on both surfaces with copper is preferable. This substrate is formed by hot pressing a copper foil having a roughened surface onto a fluorine resin substrate such as polytetrafluoroethylene or the like.

As the electroless plating, copper plating is favorable. In case of a substrate having a poor plated bond such as the fluorine resin substrate or the like, it is subjected to a surface modification such as a pretreatment with an organic metal sodium (trade name: Tetraetch, made by Junkosha Co., Ltd.), plasma treatment or the like.

② Then, thick formation is conducted by electrolytic plating. As the electrolytic plating, copper plating is favorable.

③ Further, a roughened layer is formed on the surface of the metal layer including the inner wall surface of the through-hole in the wiring substrate. As the roughened layer, there are a roughened layer formed by oxidation (graphitization)-reduction treatment, a roughened layer formed by plating treatment of copper-nickel-phosphorus needle-like alloy and the like.

The composition of an aqueous plating solution of copper-nickel-phosphorus needle-like alloy is desirable to have a liquid composition that copper ion concentration, nickel ion concentration and hypophosphite ion concentration are $2.2 \times 10^{-2}$~$4.1 \times 10^{-2}$ mol/l, $2.2 \times 10^{-3}$~$4.1 \times 10^{-3}$ mol/l and 0.20~0.25 mol/l, respectively. The crystal structure of the plated film precipitated within the above ranges is a needle-shaped structure, so that the anchor effect is excellent. Moreover, the electroless plating bath may contain a complexing agent and an additive in addition to the above compounds.

(2) Filling of a Filler into Through-holes

① The filler having the aforementioned component composition is filled in the through-holes formed by the above item (1). Concretely, the filler is applied to the substrate provided with a mask placed on an opening corresponding to the through-hole by a printing method to fill in the through-hole, and dried and cured after the filling.

To the filler may be added an anti-foaming agent such as acrylic antifoaming agent, silicon anti-foaming agent or the like, and an inorganic filler such as silica, alumina, talc or the like as the additive. Moreover, a silane coupling agent may be adhered to the surface of the inorganic filler.

Such a filler is printed, for example, under the following conditions. That is, the printing is carried out by using a printing mask plate made of Tetron(trademark) mesh and a square squeeze having 45 degree inclination under conditions of Cu paste viscosity: 120 Pa·-s, squeeze speed: 13 mm/min and squeezing amount: 1 mm.

② The filler protruded or exposed from each through-hole and the roughened layer on the electrolytic plated film surface of the substrate are removed by polishing to flatten the surface of the substrate. As the polishing, belt sander and buff polishing are favorable.

(3) Formation of Inner Conductor Circuit Pattern

① The metal layer of the substrate flattened by the item (2) is etched in the form of a pattern according to the usual manner to form inner conductor circuit patterns and through-hole lands, which is used as a core substrate.

When the cover plated layer is formed just above the through-holes, a catalyst nucleus is applied onto the surface of the substrate flattened by the item (2), which is subjected to an electroless plating and an electrolytic plating, and further an etching resist is formed thereon and portions not forming the resist are etched to form portions of the conductor circuit patterns and the cover plated layer.

As the etching solution, there are an aqueous solution of sulfuric acid-hydrogen peroxide, an aqueous solution of a persulfate such as ammonium persulfate, sodium persulfate, potassium persulfate or the like, and an aqueous solution of ferric chloride or cupric chloride.

② The same kind of roughened layer is formed on the entire surface of the core substrate including side faces of the inner conductor circuit pattern and the through-hole lands. This roughened layer is formed by an etching treatment using an aqueous mixed solution of cupric complex and organic acid. As a composition of the etching solution, for example, there is an aqueous solution of 10 parts by weight of imidazole copper (II) complex, 7 parts by weight of glycolic acid and 5 parts by weight of potassium chloride.

When the cover plated layer is formed just above the through-holes, after the formation of the conductor circuit pattern and cover plated layer portions, the etching resist is peeled off to form isolated conductor circuit patterns and cover plated layer, and a roughened layer is formed on the surfaces of the inner conductor circuit pattern and cover plated layer. This roughened layer is preferable to be the same kind as the roughened layer formed on the entire surface including side faces of the inner conductor circuit pattern and the through-hole lands, and is formed by the etching treatment with the aqueous mixed solution of cupric complex and organic acid.

Thus, when the roughened layers are formed on the inner conductor circuit patterns and the cover plated layer, the conductors are excellent in the adhesion property to the interlaminar resin insulating layer, so that there is not caused crack starting from a boundary face between side face or surface of the inner conductor circuit pattern and the cover plated layer and the resin insulating layer. And also, the cover plated layer improves the adhesion property to the via-hole electrically connected thereto.

Moreover, the following steps can be adopted as the method of forming the conductor layer.

That is, a plated resist is formed on the substrate after the steps of the above items (1) and (2), and then portions not forming the resist are subjected to an electrolytic plating to form portions of inner conductor circuit pattern and cover plated layer, a solder plated film is formed on these conductors by using an electrolytic solder plating solution comprised of tin borofluoride, lead borofluoride, hydrogen borofluoride and peptone, and the plated resist is removed and the electroless plated film and copper foil located beneath the plated resist are removed by etching to from an independent pattern, and further the solder plated film is dissolved and removed in an aqueous solution of borofluoric acid to from conductor layers.

In the invention, the side face and upper surface of the inner conductor circuit pattern including the through-hole land are simultaneously subjected to a roughening treatment without filling the filler in the recess portion between the conductors, so that the production steps of the multilayer printed wiring board are shortened and the production cost can be decreased. And also, the same kind of the roughened layers are formed on the side face and upper surface of the inner conductor circuit pattern, so that the occurrence of cracks produced due to the difference of the roughened state can be prevented.

(4) Formation of Interlaminar Resin Insulating Layer

① The interlaminar resin insulating layer is formed the thus prepared wiring board.

As the resin insulating agent, use may be made of the aforementioned thermosetting resin, thermoplastic resin, composite of thermosetting resin and thermoplastic resin, and adhesive for electroless plating.

The interlaminar resin insulating layer is formed by applying an uncured solution of the above resin insulating agent or by laminating resin films and hot-pressing them.

② Then, when being applied the uncured resin insulating agent (adhesive for electroless plating), the resin insulating layer is dried.

At the end time of the items ① and ②, the resin insulating layer formed on the inner conductor circuit pattern of the substrate is at a state of creating unevenness because the resin is not previously filled between the inner conductor circuit patterns and the thickness of the interlaminar resin insulating layer existing on the conductor circuit pattern region is thin and the thickness of the inter-laminar resin insulating layer existing on a wide area region of the inner conductor circuit pattern is thick.

③ Next, the resin insulating agent layer of the uneven state is pushed under heating (hot pressed) by using a metal plate or a metal roll to flatten the surface thereof.

The metal plate or metal roll used herein is preferably made of stainless. Because it is excellent in the corrosion resistance.

The hot pressing is carried out by sandwiching the substrate provided with the resin insulating agent layer between the metal plates or the metal rolls and pressing in a heating atmosphere. By such a hot pressing is flowed the resin insulating agent to flatten the surface of the resin insulating agent layer.

The heating temperature, pressure and time in the hot pressing differ in accordance with the resin used in the resin insulating agent. For example, when an epoxy resin is used as a resin matrix and an adhesive for electroless plating containing epoxy resin particles as a heat resistant resin particle is used as a resin insulating agent, it is desirable that the heating temperature is 40~60° C., the pressure is 3.5~6.5 kgf/cm² and the time is 30~90 seconds. Because, when the hot pressing conditions are lower than 40° C., less than 3.5 kgf/cm² and less than 30 seconds, the sufficient flatness is not obtained. On the other hand, when the pressing temperature exceeds 60° C., the curing of the resin insulating agent too proceeds prior to the light exposure and development, and when the pressing pressure exceeds 6.5 kgf/cm², there is caused a fear of flowing out the insulating resin from the substrate, and when the pressing time exceeds 90 seconds, it is expected to lower the productivity considering the conventional light exposure time and post baking time.

On the other hand, when a composite of epoxy resin acrylate and polyether sulphone is used as a resin matrix and an adhesive for electroless plating containing epoxy resin particles as a heat-resistant resin particle is used as a resin insulating agent, it is desirable that the heating temperature is 60~70° C., the pressure is 15~25 kgf/cm², and the time is 15~25 minutes.

Moreover, when using the metal rolls, the hot pressing can be conducted while transferring the substrate, which is advantageous from a viewpoint of the mass production. Particularly, it is advantageous to use a combination of a roll of an elastomer such as rubber or the like and the metal roll. For example, the hot pressing is first conducted by the rubber rolls and subsequently the hot pressing is conducted by the metal rolls. In this case, the substrate provided with the interlaminar resin insulating layer is preliminarily heated by the rubber rolls, and then the preheated substrate is flattened by the metal rolls.

In the invention, when the resin insulating agent is photosensitive, a transparent film can be laid onto the resin insulating layer prior to the hot pressing, if necessary.

The transparent film is used for preventing film reduction in the development and the lowering of peel strength due to the obstruction of photopolymerization reaction through oxygen. Therefore, the lowering of the peel strength is not caused even at a shallow anchor depth.

Moreover, the film is desirable to be coated with a tackifier on a surface to be adhered. Because, the adhesion property to the interlaminar resin insulating layer can be ensured. The tackifier is not particularly restricted, but ones described in TACKIFIER UTILIZING NOTE, edited by Takashi Ibonai, Koei Komatsu and Yoshiaki Kitazaki, printed by Kogyo Chosakai can be used. For example, there are mentioned natural rubber-based, styrene-butadiene-based, polyisobutylene-based, isoprene-based, acryl-based, acrylic emulsion-based, silicon-based, natural rubber-butadiene latex-based tackifiers.

Concretely, there may be mentioned tackifiers having the following compositions:

| | |
|---|---|
| (Natural rubber-based) | |
| natural rubber | 100 parts by weight |
| tackifying resin | 150~120 parts by weight |
| zinc white | 25~50 parts by weight |
| calcium carbonate | 35~60 parts by weight |
| carbon black | ~15 parts by weight |
| antioxidant | ~1.5 parts by weight |
| sulfur | 0.5~2.25 parts by weight |
| (Styrene-butadiene based) | |
| rubber latex | 100 parts by weight |
| high-melting point tackifying agent | 89 parts by weight |
| soap-forming resin acid | 5.6 parts by weight |
| antioxidant | 4.8 parts by weight |
| ammonia water | 0.7 part by weiqht |
| water | 151 parts by weight |
| (Polyisobutylene-based) | |
| polyisobutylene | 100 parts by weight |
| polybutene | 10 parts by weight |
| white oil | 20 parts by weight |
| (Isoprene-based) | |
| trade name: Kuraprene IR-10, made by Kurare Corp. | |
| (Acryl-based) | |
| 2-ethylhexyl acrylate | 78 parts by weight |
| methyl acrylate | 20 parts by weight |
| maleic anhydride | 2 parts by weight |
| hexamethylenediamine | 0.5 part by weight |
| (Acrylic emulsion-based) | |
| 2-ethylhexyl acrylate | 70 parts by weight |
| vinyl acetate | 30 parts by weight |
| acrylic acid | 2 parts by weight |
| (Silicone-based) | |
| silicone rubber | 100 parts by weight |
| silicone resin | 80~120 parts by weight |
| condensation catalyst | 0.01~0.5 part by weight |
| solvent | 100~150 parts by weight |

In the invention, the transparent film is stuck onto the resin insulating layer of the uneven state and then hot pressed, or the resin insulating layer of the uneven state is flattened by hot pressing and then the transparent film is stuck thereonto. The sticking of the transparent film after the flattening is advantageous because the resin is easily moved and the flattening of the resin insulating layer is easy.

④ The resin insulating layer is cured to form the interlaminar resin insulating layer, while an opening for the formation of the via-hole is formed in the interlaminar resin insulating layer in order to ensure electrical connection between innerlayer conductor circuit pattern formed on the substrate and outerlayer conductor circuit pattern to be formed later, or between the outerlayer conductor circuit pattern and the through-hole.

The opening for the formation of the via-hole is formed by light exposure and development when the resin insulating agent is comprised of the photosensitive resin, or by laser beam when it is comprised of thermosetting resin or thermoplastic resin. As the laser beam used, there are carbon dioxide gas laser, ultraviolet ray laser, excimer laser and the like. In case of forming the hole through the laser beam, desmear treatment may be conducted. The desmear treatment can be carried out by using an oxidizing agent comprised of an aqueous solution of chromic acid, permanganate or the like, or may be conducted by oxygen plasma or the like.

⑤ Then, the surface of the interlaminar resin insulating layer provided with the opening for the formation of the via-hole is roughened, if necessary.

When using the aforementioned adhesive for electroless plating as a resin insulating agent, the surface is roughened by treating with an acid or an oxidizing agent to selectively dissolve or decompose and remove only the heat-resistant resin particles existing on the surface of the adhesive layer. Even in case of using the thermosetting resin or thermoplastic resin, it is effective to conduct surface roughening treatment with an oxidizing agent comprised of an aqueous solution selected from chromic acid, permanganate and the like. Moreover, in case of the resin not roughened with the oxidizing agent such as fluorine resin (polytetrafluoroethylene) and the like, the surface may be roughened by plasma treatment, tetraetch or the like. In this case, the depth of the roughened surface is about 1~5 $\mu$m.

As the acid, there are phosphoric acid, hydrochloric acid, sulfuric acid and organic acid such as formic acid, acetic acid or the like. Among them, it is particularly desirable to use the organic acid. Because, in the roughening treatment, a metal conductor layer exposed from the via-hole is hardly corroded.

As the oxidizing agent, it is desirable to use an aqueous solution of chromic acid or permanganate (potassium permanganate or the like).

(5) Formation of Outerlayer Conductor Circuit Pattern

① A catalyst nucleus for electroless plating is applied to the wiring substrate having the roughened surface of the interlaminar resin insulating layer.

In general, the catalyst nucleus is a palladium-tin colloid. The substrate is immersed in this solution, dried, and heated to fix the catalyst nucleus to the resin surface. And also, a metal nucleus can be struck onto the resin surface by CVD, sputtering or plasma to form the catalyst nucleus. In this case, the metal nucleus is embedded into the resin surface, so that the plated layer is precipitated around the metal nucleus to form the conductor circuit pattern and hence the adhesion property can be ensured even in the hardly roughening resin or the resin having poor adhesion to the conductor circuit pattern such as fluorine resin (polytetrafluoroethylene or the like). As the metal nucleus, there is at least one selected from palladium, silver, gold, platinum, titanium, copper and nickel. Moreover, the amount of the metal nucleus is preferably not more than 20 $\mu$g/cm$^2$. When the amount exceeds the above value, it is required to remove the metal nucleus.

② Then, the surface of the interlaminar resin insulating layer is subjected to an electroless plating to form a thin electroless plated film having irregularities over the full roughened surface therealong. In this case, the thickness of the electroless plated film is 0.1~5 $\mu$m, preferably 0.5~3 $\mu$m.

③ Next, a plating resist is formed on the electroless plated film. As the plating resist composition, it is particularly desirable to use a composition comprising an acrylate of cresol novolac type epoxy resin or phenol novolac type epoxy resin and an imidazole curing agent, but a commercially available dry film may be used.

④ Then, the substrate provided with the electroless plated film is washed with water of 10~35° C., desirably 15~30° C.

Because, when the water washing temperature exceeds 35° C., water evaporates and the surface of the electroless plated film is dried and oxidized, so that there is caused no precipitation of electrolytic plated film. As a result, the electroless plated film is dissolved by etching treatment and portions not existing the conductor are created. On the other hand, when it is lower than 10° C., the solubility of contaminant substance to water lowers and the washing power lowers. Particularly, as the diameter of the land in the via-hole becomes not more than 200 $\mu$m, the plating resist repels water to easily evaporate water, so that it is easy to cause a problem of precipitating no electrolytic plated film.

Moreover, various surfactants, acid and alkali may be added to the washing water. And also, an acid such as sulfuric acid or the like may be cleaned after the washing.

⑤ The portions not forming the plating resist are subjected to an electrolytic plating to form conductor circuit patterns and conductor portion as a via-hole.

As the electrolytic plating, it is desirable to use copper plating. The plated thickness is 10~20 $\mu$m.

⑥ Furthermore, after the plating resist is removed, the electroless plated film beneath the plating resist is dissolved and removed with an etching solution such as a mixed solution of sulfuric acid and hydrogen peroxide, aqueous solution of sodium persulfate, ammonium persulfate or the like, whereby there are obtained individual outer conductor circuit patterns and via-holes each consisting of two layers of the electroless plated film and the electrolytic plated film.

(6) Multilayer Formation of Wiring Board

After the roughened layer is formed on the surface of the outer conductor circuit pattern formed in the above item (5), the steps (4) and (5) are further repeated to form outer-layer conductor circuit patterns, whereby there is produced a given multilayer printed wiring board.

EXAMPLE 1

A. Preparation of adhesive for electroless plating in upper layer

①. 35 parts by weight of a resin solution formed by dissolving a 25% acrylated product of cresol novolac type epoxy resin (made by Nippon Kayaku Co., Ltd. molecular weight: 2500) in DMDG at a concentration of 80% is mixed with 3.15 parts by weight of a photosensitive monomer (made by Toa Gosei Co., Ltd. Aronix M315), 0.5 part by weight of anti-foaming agent (made by Sannopuco S-65) and 3.6 parts by weight of NMP with stirring.

②. 12 parts by weight of polyether sulphone (PES) is mixed with 7.2 parts by weight of epoxy resin particles (made by Sanyo Kasei Co., Ltd. Polymerpol) having an average particle size of 1.0 $\mu$m and 3.09 parts by weight of the resin particles having an average particle size of 0.5 $\mu$m and added with 30 parts by weight of NMP, which are mixed in beads mill with stirring.

③. 2 parts by weight of an imidazole curing agent (made by Shikoku Kasei Co., Ltd. 2E4MZ-CN) is mixed with 2 parts by weight of a photoinitiator (made by Ciba Geigy Irgaqua I-907), 0.2 part by weight of a photosensitizer (made by Nippon Kayaku Co., Co. DETX-S) and 1.5 parts by weight of NMP with stirring.

They are mixed to prepare an adhesive for electroless plating to be used as an adhesive at an upper layer constituting the interlaminar resin insulating layer of two-layer structure.

B. Preparation of interlaminar resin insulating layer in lower layer

①. 35 parts by weight of a resin solution formed by dissolving a 25% acrylated product of cresol novolac type epoxy resin (made by Nippon Kayaku Co., Ltd. molecular weight: 2500) in DMDG at a concentration of 80% is mixed with 4 parts by weight of a photosensitive monomer (made by Toa Gosei Co., Ltd. Aronix M315), 0.5 part by weight of anti-foaming agent (made by Sannopuco S-65) and 3.6 parts by weight of NMP with stirring.

②. 12 parts by weight of polyether sulphone (PES) is mixed with 14.49 parts by weight of epoxy resin particles (made by Sanyo Kasei Co., Ltd. Polymerpol) having an average particle size of 0.5 μm and added with 30 parts by weight of NMP, which are mixed in beads mill with stirring.

③. 2 parts by weight of an imidazole curing agent (made by Shikoku Kasei Co., Ltd. 2E4MZ-CN) is mixed with 2 parts by weight of a photoinitiator (made by Ciba Geigy Irgaqua I-907), 0.2 part by weight of a photosensitizer (made by Nippon Kayaku Co., Co. DETX-S) and 1.5 parts by weight of NMP with stirring.

They are mixed to prepare a resin composition used as an insulating agent layer in a lower layer constituting the interlaminar resin insulating layer of two-layer structure.

C. Preparation of Resin Filler

①. 100 parts by weight of bisphenol F-type epoxy monomer (made by Yuka Shell Co., Ltd. molecular weight: 310, YL983U), 170 parts by weight of $Sio_2$ particles coated with a silane coupling agent and having an average particle size of 1.6 μm (made by Adomatec Co., Ltd. CRS 1101-CE, a size of greatest particle is not more than a thickness (15 μm) of innerlayer copper pattern mentioned later) and 1.5 parts by weight of a leveling agent (made by Sannopuco Co., Ltd. Perenol S4) are kneaded through three rolls and a viscosity of the resulting mixture is adjusted to 45,000~49,000 cps at 23±1° C.

②. 6.5 parts by weight of an imidazole curing agent (made by Shikoku Kasei Co., Ltd. 2E4MZ-CN)

They are mixed to prepare a resin filler.

Figure 4:
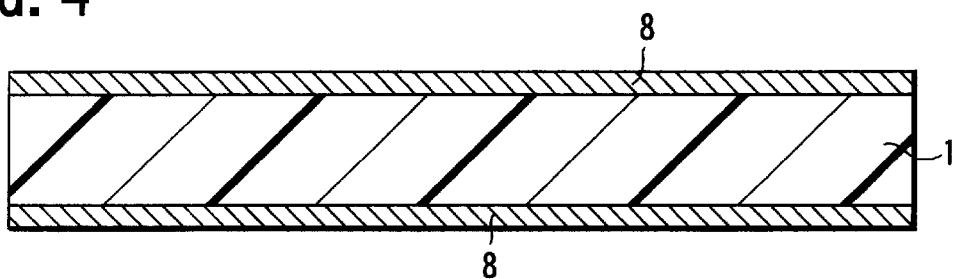
Figure 5:
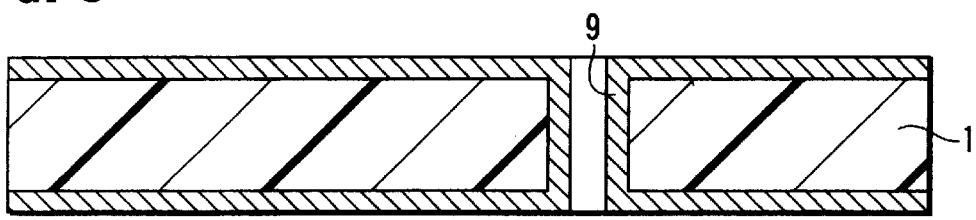

D. Production of Printed Wiring Board (1) There is used a copper clad laminate obtained by laminating copper foil 8 of 18 μm on both surfaces of a substrate 1 made from a glass epoxy resin or BT (bismaleimide triazine) resin having a thickness of 1 mm as a starting material (see FIG. 4). At first, the copper clad laminate is drilled and subjected to electroless plating and electrolytic plating to from a through-hole 9 (see FIG. 5).

Figure 6:
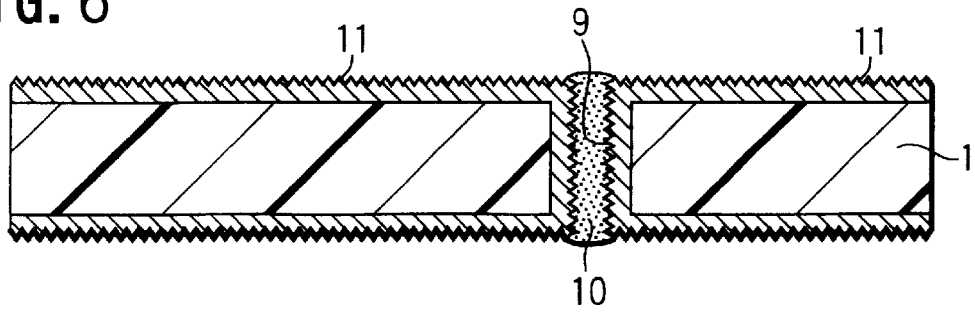

Then, the surface of the copper foil including the vbthrough-hole 9 is subjected to oxidation-reduction treatment using an aqueous solution of NaOH (20 g/l), $NaClO_2$ (50 g/l) and $Na_3PO_4$ (15.0 g/l) as an oxidation bath and an aqueous solution of NaOH (2.7 g/l) and $NaBH_4$ (1.0 g/l) as a reduction bath to form a roughened layer 11 over a full surface of the conductor including the through-hole 9 (see FIG. 6).

Figure 7:
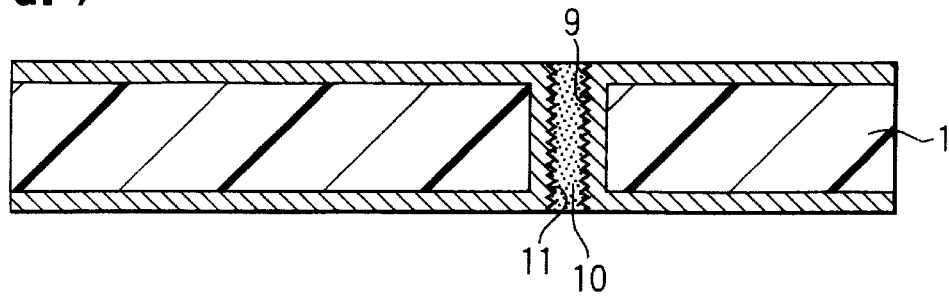

(3) The resin filler 10 prepared in the above item C is filled in the through-hole 9 through a mask having an opening at a position corresponding to through-hole part by a screen printing method, dried and cured (see FIG. 6). Furthermore, the filler 10 on the roughened layer 11 above the copper foil and protruded from the through-hole 9 is removed by a belt sander polishing with a #600 belt sander paper (made by Sankyo Rika Co., Ltd.) (See FIG. 7).

Figure 8:
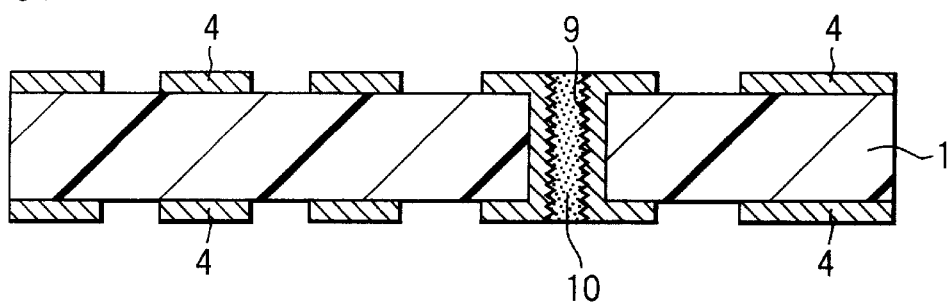

(4) Then, the copper foil is etched according to the usual manner with an aqueous solution of, for example, ferric chloride to form inner conductor circuit patterns and through-hole land (see FIG. 8).

Figure 9:
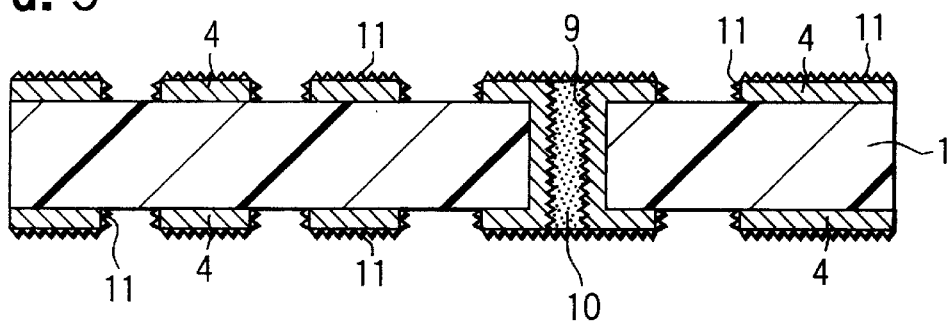

Further, a roughened layer (uneven layer) 11 of 2.5 μm made of copper-nickel-phosphorus alloy is formed on full surface including lateral surfaces of the inner conductor circuit pattern and the through-hole land and Sn layer of 0.3 μm in thickness is further formed on the surface of the roughened layer 11 (see FIG. 9 provided that Sn layer is not shown).

The formation method is as follows. That is, the substrate is acidically degreased, soft-etched, treated with a catalyst solution of palladium chloride and organic acid to give a Pd catalyst. After the activation of the catalyst, it is subjected to a plating in an electroless plating bath made of an aqueous solution of 8 g/l of copper sulfate, 0.6 g/l of nickel sulfate, 15 g/l of citric acid, 29 g/l of sodium hypophosphite, 31 g/l of boric acid and 0.1 g/l of a surfactant (made by Nisshin Kagaku Kogyo Co., ltd. Surfinol 465) and having pH=9 to form a roughened layer 11 made from copper-nickel-phosphorus alloy over full surface of the inner conductor circuit patterns 4 including the through-hole 9. Further, the substrate is subjected to a heating treatment at 1000 for 30 minutes, 120° C. for 30 minutes and 150° C. for 2 hours, treated with an aqueous solution of 10% by weight of sulfuric acid and an aqueous solution of 0.2 mol/l of borofluoric acid, and subjected to Cu—Sn substitution reaction with an aqueous solution of 0.1 mol/l of tin borofluoride and 1.0 mol/l of thiourea at a temperature of 50° C. and pH=1.2 to form Sn layer of 0.3 μm in thickness on the surface of the roughened layer 11 (Sn layer is not shown).

(5) Onto both surfaces of the substrate are applied the resin insulating agent of the item B (viscosity: 15 Pa·s) by means of a roll coater, which is left to stand at a horizontal state for 20 minutes and dried at 60° C. for 30 minutes to form a resin insulating agent layer 2a. Furthermore, the adhesive for electroless plating of the item A (viscosity: 8 Pa·s) is applied onto the resin insulating agent layer 2a by means of a roll coater and dried at 55° C. for 40 minutes to form an adhesive layer 2b to thereby form an interlaminar resin insulating layer 2 (see FIG. 10). In this case, the surface of the inter-laminar resin insulating layer 2 is not flat due to the unevenness between the conductors.

Figure 10:
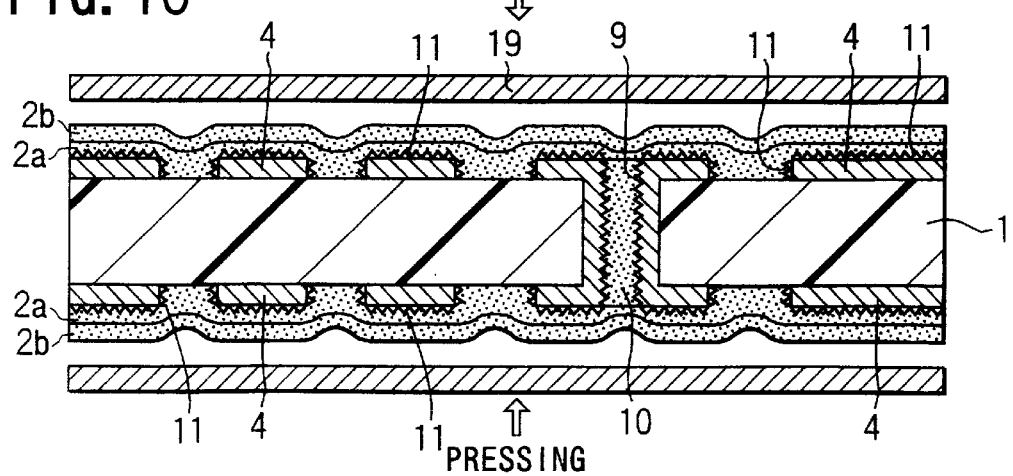
Figure 11:
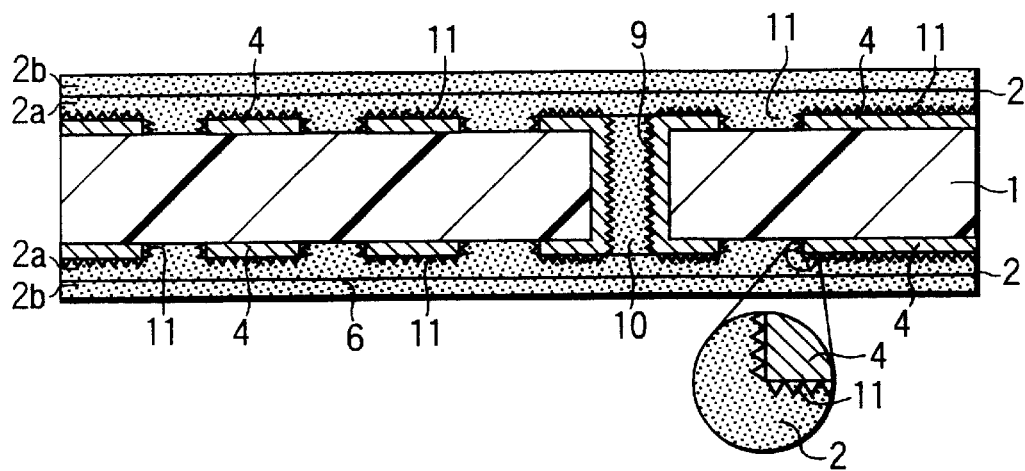

(6) After a polyethylene terephthalate film (not shown) is adhered onto the surface of the interlaminar resin insulating layer 2 formed in the above item (5), it is sandwiched between stainless plates 19 and hot pressed by pressurizing at 20 kgf/cm² for 20 minutes while heating at 65° C. in a hot furnace (see FIG. 10). By this hot pressing is flattened the surface of the interlaminar resin insulating layer 2 (see FIG. 11).

Figure 12:
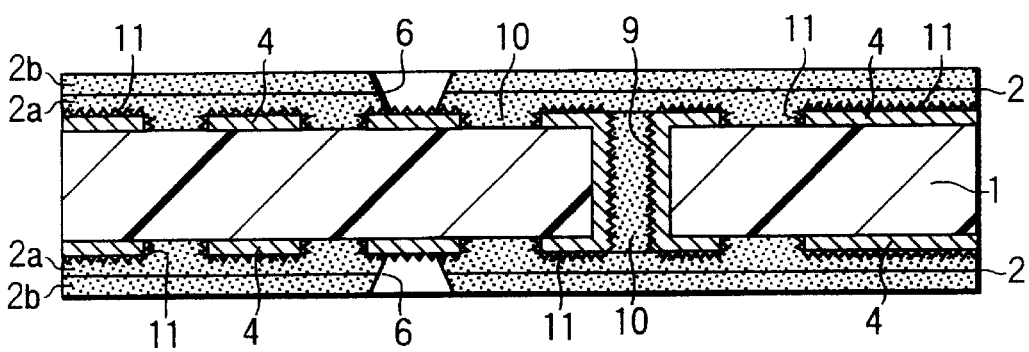

(7) A photomask film printed with black circles of 85 μm is adhered onto the each of both surfaces of the substrate flattened in the item (6) and exposed to a super-high pressure mercury lamp at 500 mJ/cm². This is spray-developed with DMDG solution to form openings of 85 μm for via-holes in the interlaminar resin insulating layer 2. Further, the substrate is exposed to a super-high pressure mercury lamp at 3000 mJ/cm² and heated at 100° for 1 hour and 150° C. for 5 hours to form the interlaminar resin insulating layer of 35 μm having openings (openings for the formation of via-hole 6) with an excellent size accuracy corresponding to the photomask film (see FIG. 12). Moreover, the tin plated layer is locally exposed in the opening for the via-hole.

Figure 13:
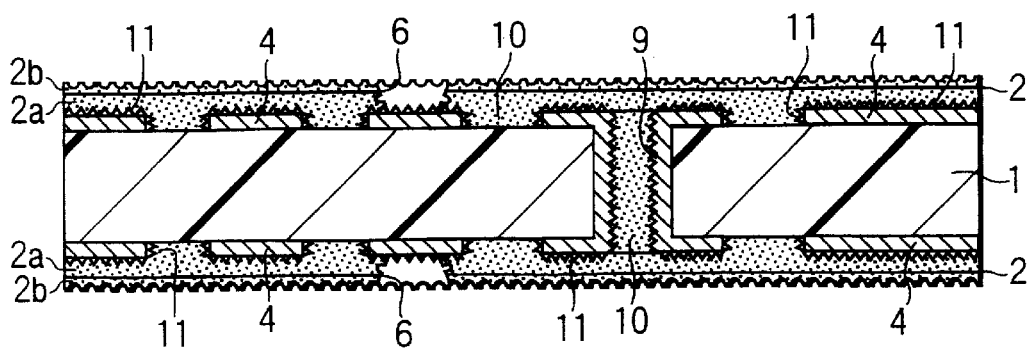

(8) The substrate provided with the openings for the formation of the via-hole is immersed in an aqueous solution of 800 g/l of chromic acid at 70° C. for 19 minutes to dissolve and remove the epoxy resin particles existing on the surface of the adhesive layer 2b of the interlaminar resin insulating layer 2, whereby the surface of the inter-laminar resin insulating layer 2 is roughened (depth: 3 μm) and immersed in a neutral solution (made by Shipley) and washed with water (see FIG. 13).

Further, the palladium catalyst (made by Atotec) is given to the surface of the substrate subjected to the roughening treatment, whereby the catalyst nucleus is applied onto the surface of the interlaminar resin insulating layer 12 and the inner wall face of the opening 6 for the viahole.

Figure 14:
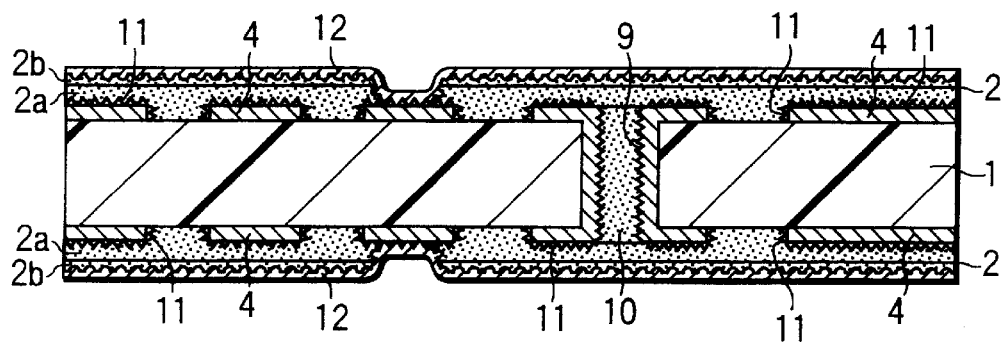

(9) The substrate is immersed in an aqueous solution for electroless copper plating having the following composition to form an electroless copper plated film 12 having a thickness of 0.6 μm over a full roughened surface (see FIG. 14). In this case, irregularities are observed on the surface of the electroless plated film because the plated film is thin.

| [Aqueous solution for electroless plating] | |
|---|---|
| EDTA | 150 g/l |
| Copper sulfate | 20 g/l |
| HCHO | 30 ml/l |
| NaOH | 40 g/l |
| α,α'-bipyridyl | 80 mg/l |
| PEG | 0.1 g/l |

Electroless Plating Condition liquid temperature of 70° C., 30 minutes

Figure 15:
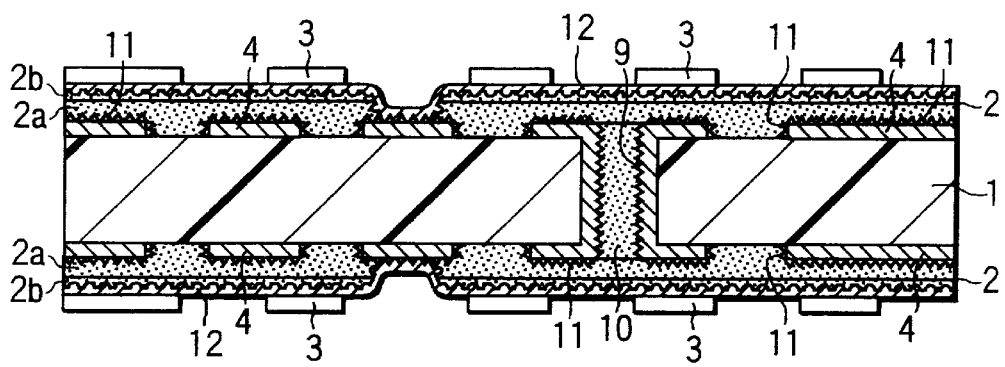

(10) A commercially available photosensitive dry film is attached to the electroless plated film 12 formed in the item (9), and a mask is placed thereonto and exposed to a light at 100 mJ/cm² and developed with 0.8% sodium carbonate to form a plated resist 3 having a thickness of 15 μm (see FIG. 15).

Figure 16:
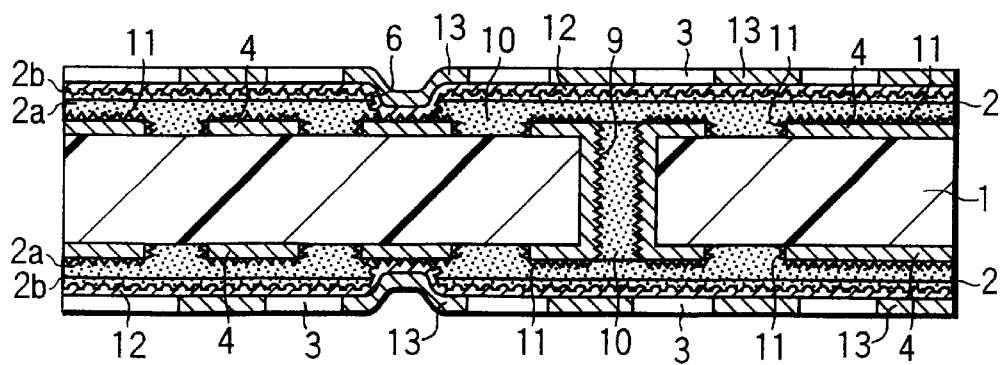

(11) Then, the substrate is washed with water at 50° C., degreased, washed with water at 25° C., further washed with sulfuric acid and subjected to an electrolytic copper plating under the following conditions to form an electrolytic copper plated film 13 having a thickness of 15 μm (see FIG. 16).

| [Aqueous solution for electrolytic plating] | |
|---|---|
| Sulfuric acid | 180 g/l |
| Copper sulfate | 80 g/l |
| Additive (made by Adotec Japane, Kaparacid GL) | 1 ml/l |
| [Electrolytic plating condition] | |
| Current density | 1 A/dm² |
| Time | 30 minutes |
| Temperature | room temperature |

Figure 17:
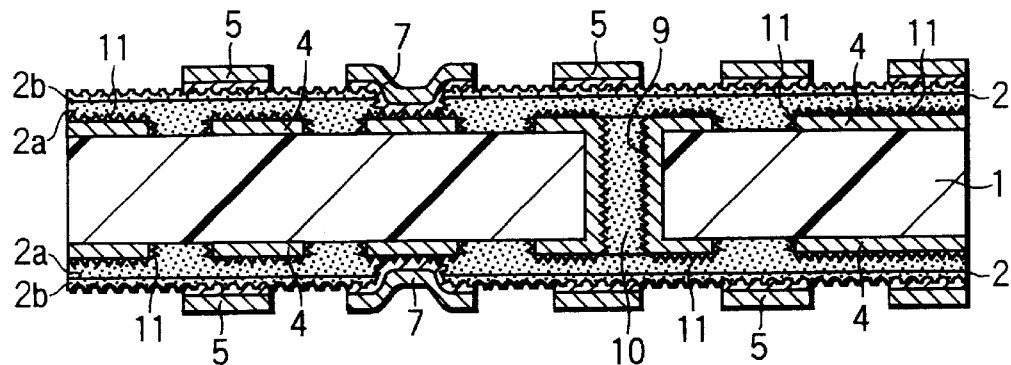

(12) After the plated resist 3 is peeled and removed with an aqueous solution of 5% KOH, the electroless plated film 12 beneath the plated resist 3 is dissolved and removed by etching with a mixed solution of sulfuric acid and hydrogen peroxide to form inner conductor circuit patterns (including via-hole 7) comprised of the electroless copper plated film 12 and the electrolytic copper plated film 13 and having a thickness of 18 μm (see FIG. 17). Further, it is immersed in an aqueous solution of 800 g/l of chromic acid at 70° C. for 3 minutes, whereby the surface of the adhesive layer for electroless plating between the conductor circuit patterns located in portions not forming the conductor circuit pattern is etched by 1 μm to remove the palladium catalyst remaining on the surface thereof.

Figure 18:
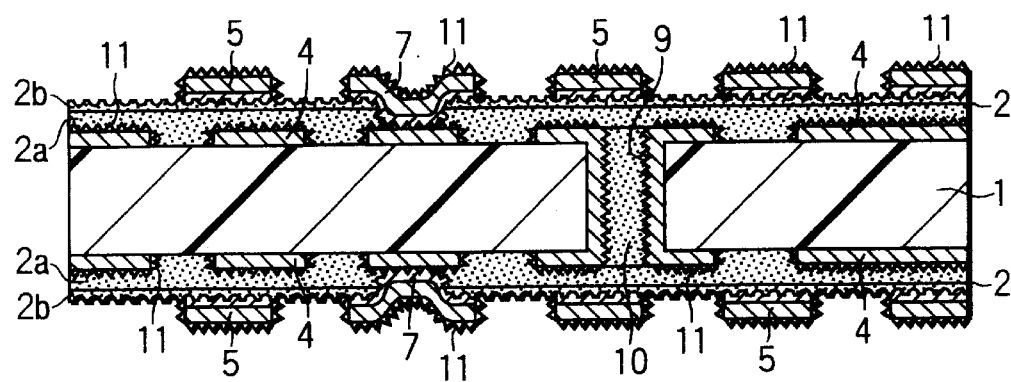
Figure 19:
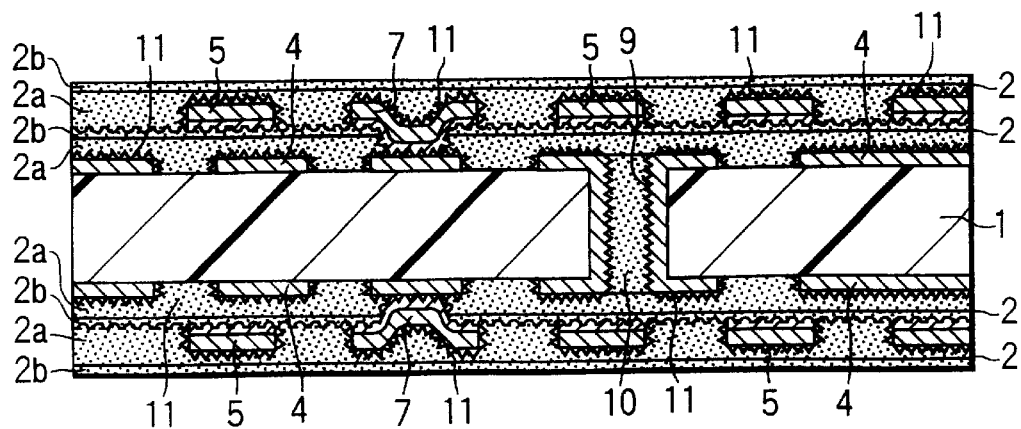
Figure 20:
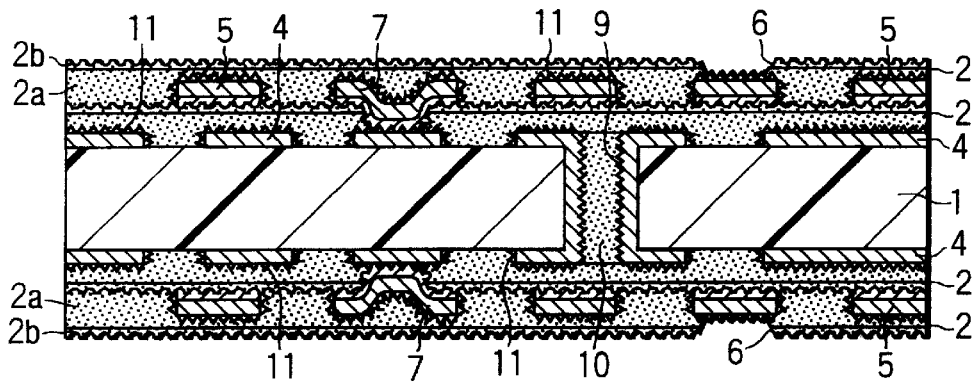
Figure 21:
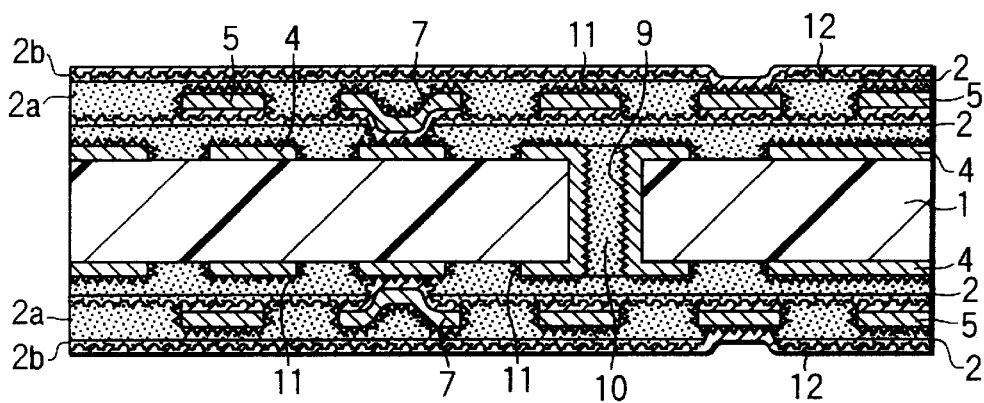
Figure 22:
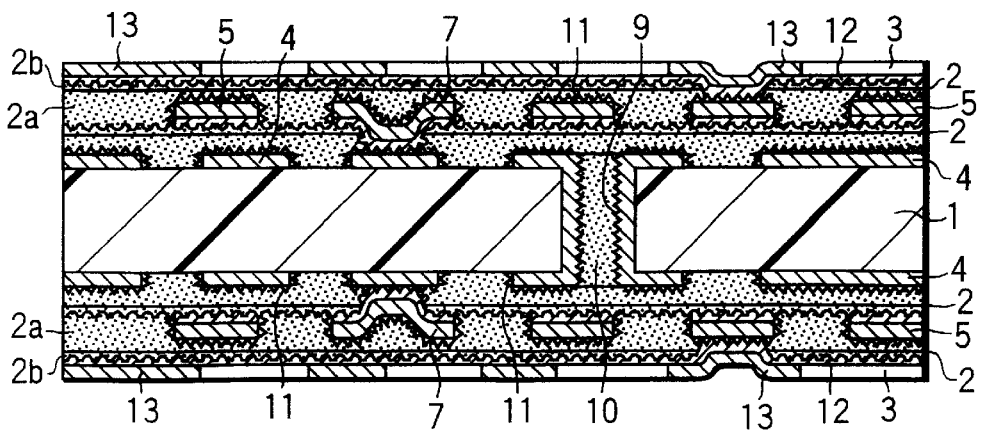
Figure 23:
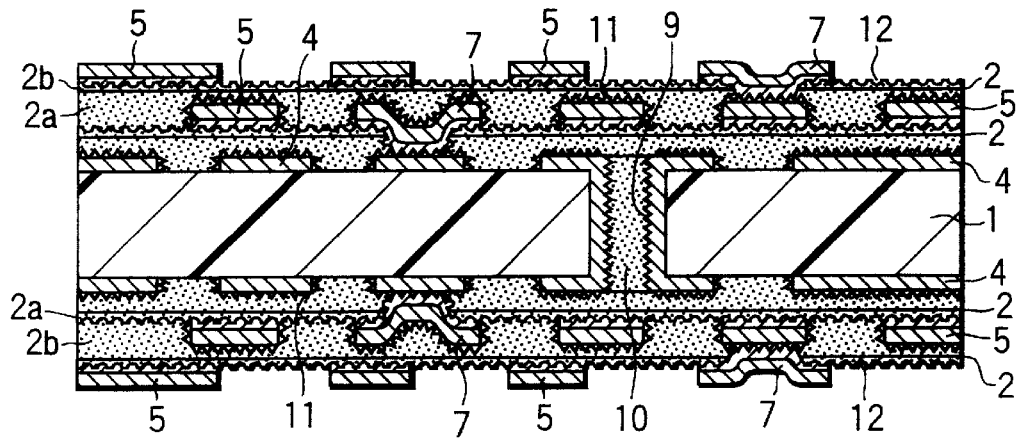
Figure 24:
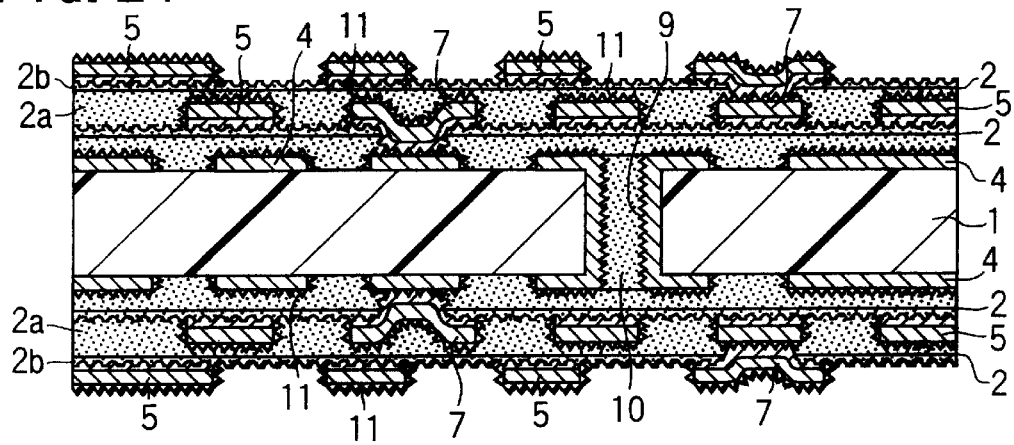

(13) The substrate provided with the inner conductor circuit patterns 5 is immersed in an electroless plating solution comprising an aqueous solution of 8 g/l of copper sulfate, 0.6 g/l of nickel sulfate, 15 g/l of citric acid, 29 g/l of sodium hypophosphite, 3 g/l of boric acid and 0.1 g/l of a surfactant (made by Nisshin Kagaku Kogyo Co., Ltd., Surfynol 465) and having pH=9 to form a roughened layer 11 of copper-phosphorus-nickel having a thickness of 3 μm on the surfaces of the inner conductor circuit patterns 5 (see FIG. 18). In this case, the resulting roughened layer 11 has a composition ratio of Cu: 98 mol %, Ni: 1.5 mol % and P: 0.5 mol % as analyzed by EPMA (fluorescent X-ray analytical device).

Further, Sn layer having a thickness of 0.3 μm is formed on the surface of the roughened layer 11 by Cu—Sn substitution reaction using an aqueous solution of 0.1 mol/l of tin borofluoride and 1.0 mol/l of thiourea under conditions of temperature: 50° C. and pH=1.2 (Sn layer is not shown).

(14) By repeating the above steps (5)~(13) are further formed outerlayer conductor circuit patterns to obtain a multilayer printed wiring board. However, the flattening of the outerlayer interlaminar resin insulating layer and Sn substitution in the outermostlayer conductor circuit pattern are not carried out (see FIGS. 19~24).

(15) On the other hand, a solder resist composition is obtained by mixing 46.67 parts by weight of a photosenitizing monomer (molecular weight: 4000) wherein 50% of epoxy group in 60 wt % of cresol novolac type epoxy resin (made by Nippon Kayaku Co., Ltd.) dissolved in DMDG is acrlyated, 15.0 parts by weight of 80 wt % of bisphenol A-type epoxy resin (made by Yuka Shell Co., Ltd., Epikote 1001) dissolved in methyl ethyl ketone, 1.6 parts by weight of imidazole curing agent (made by Shikoku Kasei Co., Ltd., 2E4MZ-CN), 3 parts by weight of a polyvalent acrylic monomer (made by Nippon Kayaku Co., Ltd., R604) as a photosensitive monomer, 1.5 parts by weight of a polyvalent acrylic monomer (made by Kyoeisha Kagaku Co., Lt., DPE6A) and 0.71 part by weight of a dispersion anti-foaming agent (made by Sannopuco, S-65), and adding 0.2 part by weight of benzophenone (made by Kanto Kagaku Co., Ltd.) as a photoinitiator and 0.2 part by weight of Michler ketone (made by Kanto Kagaku Co., Ltd.) as a photosensitizer. (16) Onto both surfaces of the multilayer printed wiring board obtained in the above item (14) is applied the above solder resist composition at a thickness of 20 μm. Then, it is dried at 70° C. for 20 minutes and 70° C. for 30 minutes, and thereafter a soda lime glass substrate depicted with circle pattern corresponding to opening portions of the solder resist (mask pattern) with chromium layer is closed to the solder resist layer at a side facing the chromium layer, which is exposed to a ultraviolet ray at 1000 mJ/cm² and developed with DMDG. Further, it is subjected to a heating treatment under conditions of 80° C. for 1 hour, 100° C. for 1 hour, 120° C. for 1 hour and 150° C. for 3 hours to form a solder resist pattern layer 14 (thickness: 20 μm) opening the upper surface of the solder pad, the via-hole and land portion (opening diameter: 200 μm).

(17) Then, the substrate formed with the solder resist pattern layer 18 is immersed in an electroless nickel plating solution comprising an aqueous solution of 30 g/l of nickel chloride, 10 g/l of sodium hypophosphite and 10 g/l of sodium citrate and having pH=5 for 20 minutes to form a nickel plated layer 15 having a thickness of 5 μm on the opening portion. Further, the substrate is immersed in an electroless gold plating solution comprising an aqueous solution of 2 g/l of potassium gold cyanide, 75 g/l of ammonium chloride, 50 g/l of sodium citrate and 10 g/l of sodium hypophosphite at 93° C. for 23 seconds to form a gold plated layer 16 having a thickness of 0.03 μm on the nickel plated layer 15.

Figure 25:
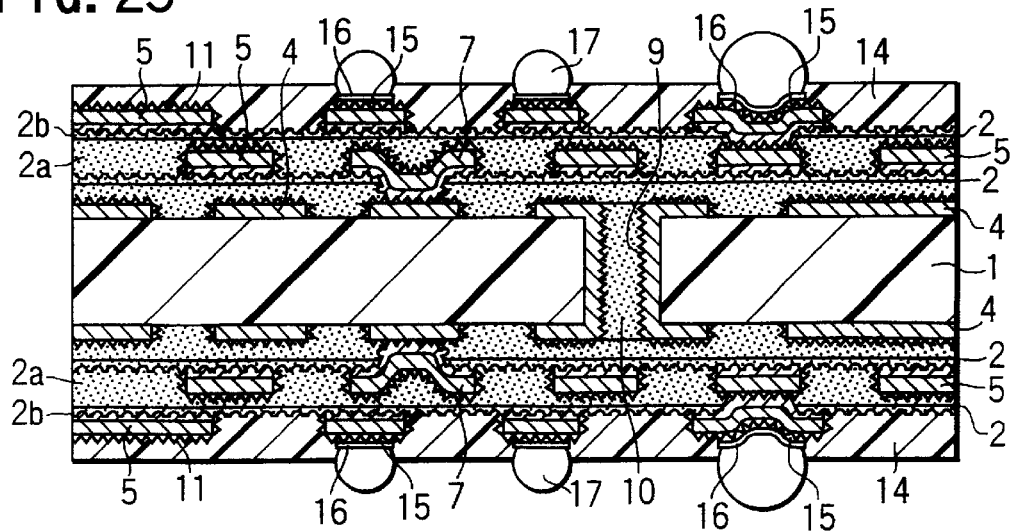

(18) A solder paste is printed on the opening portion of the solder resist pattern layer 14 and reflowed at 200° C. to form a solder bump (solder body) 17, whereby there is produced a multilayer printed wiring board having solder bumps 17 (see FIG. 25).

EXAMPLE 2

(1)~(3) The treatment is carried out according to the same steps as in the items (1)~(3) of Example 1.

(4) Then, the copper foil is treated according to usual manner, for example, by etching with an aqueous solution of ferric chloride or the like to form inner conductor circuit patterns and through-hole land (see FIG. 8).

To the full surface including side faces of the inner conductor circuit patterns 5 and the through-hole lands is sprayed an etching solution comprising 10 parts by weight of imidazole copper (II) complex, 7 parts by weight of glycolic acid and 5 parts by weight of potassium chloride, i.e. "Mechetchbond", trade name of Mech Corporation, which is transferred to conduct the etching, whereby a roughened layer is formed. The resulting roughened surface has a height of 3 μm. (Tin layer is not formed.) (5)~(12) The treatment is carried out according to the same steps as in the items (5)~(12) of Example 1.

(13) The substrate provided with the inner conductor circuit patterns 5 is sprayed with an etching solution comprising 10 parts by weight of imidazole copper (II) complex, 7 parts by weight of glycolic acid and 5 parts by weight of potassium chloride, i.e. "Mechetchbond", trade name of Mech Corporation, which is transferred to conduct the etching, whereby a roughened layer is formed. The resulting roughened surface has a height of 3 μm. (Tin layer is not formed.)

(14) The treatment is carried out according to the same steps (14)~(18) of Example 1 to produce a multilayer printed wiring board (see FIG. 25).

Comparative Example 1

(1) There is provided a copper clad laminate formed by laminating copper foils of 18 μm onto both surfaces of a substrate made of glass epoxy resin or BT (bismaleimide triazine) resin having a thickness of 1 mm as a starting material. At first, the copper clad laminate is drilled and a plating resist is formed and subjected to an electroless plating treatment to form a through-hole, and further the copper foil is etched in form of a pattern according to usual manner to form innerlayer copper patterns on both surfaces of the substrate.

(2) The substrate formed with the innerlayer copper patterns is washed with water, dried and treated with an aqueous solution of NaOH (10 g/l), $NaCl_2$ (40 g/l) and $Na_3PO_4$ (6 g/l) as an oxidation bath and an aqueous solution of NaOH (10 g/l) and $NaBH_4$ (6 g/l) as a reduction bath to form a roughened layer over a full surface of the conductor circuit patterns and the through-hole.

(3) The resin filler described on item C of Example 1 is printed onto both surfaces of the substrate having opening corresponding to the through-hole portion placed with a metal printing mask by means of a roll coater to fill between the conductor circuit patterns or in the through-holes and cured by heating at 100° C. for 1 hour, 120° C. for 3 hours, 150° C. for 1 hour and 180° C. for 7 hours. That is, the resin filler is filled between the innerlayer copper patterns or in the through-hole at this step.

(4) A surface of the substrate treated in the item (3) is polished by a belt sander polishing using #600 bent polishing paper (made by Sankyo Rikagaku Co., Ltd.) so as not to remain the resin filler on the surface of the innerlayer copper pattern or the land surface of the through-hole and then subjected to buffing for removing flaws based on the belt sander polishing. Such a series of polishing is applied to the other surface of the substrate.

Thus, the surface layer portion of the resin filler filled in the through-hole and the like and the roughened layer on the upper surface of the innerlayer conductor circuit pattern are removed to flatten both surfaces of the substrate, whereby there is obtained a wiring substrate wherein the resin filler is strongly adhered to the side face of the conductor circuit pattern through the roughened layer and the inner wall face of the through-hole is strongly adhered to the resin filler through the roughened layer. That is, the surface of the resin filler and the surface of the innerlayer copper pattern become the same plane at this step. Here, the curing resin filled has a Tg point of 155.6° C. and a linear thermal expansion coefficient of $44.5 \times 10^{-5}$/° C.

(5) Further, copper-nickel-phosphorus alloy coated layer of 5 μm in thickness, copper-nickel-phosphorus needle-shaped alloy roughened layer of 2 μm in thickness are formed on the upper surfaces of the exposed inner conductor circuit pattern and through-hole land and Sn metal coated layer of 0.3 μm in thickness is formed on the surface of the roughened layer.

The formation of these layers are as follows. That is, the substrate is acidically degreased, soft-etched and treated with a catalyst solution of palladium chloride and organic acid to form Pd catalyst. After the catalyst is activated, the substrate is immersed in an electroless copper plating bath comprising an aqueous solution of 8 g/l of copper sulfate, 0.6 g/l of nickel sulfate, 15 g/l of citric acid, 29 g/l of sodium hypophosphite, 31 g/l of boric acid and 0.1 g/l of a surfactant (made by Nisshin Kagaku Kogyo Co., Ltd. Surfynol 104) and having pH=9 while vibrating the substrate in a longitudinal direction every 4 seconds to precipitate the plated layer. After 3 minutes, air is bubbled to first precipitate copper-nickel-phosphorus non-needle coated layer on the surface of the surfaces of the copper conductor circuit pattern and the through-hole and then precipitate copper-nickel-phosphorus needle-shaped alloy to thereby form roughened layers.

Further, it is subjected to a heating treatment at 100° C. for 30 minutes, 120° C. for 30 minutes and 150° C. for 2 hours and treated with an aqueous solution of 10 vol % of sulfuric acid and an aqueous solution of 0.2 mol/l of borofluoric acid and subjected to Cu—Sn substitution reaction with an aqueous solution of 0.1 mol/l of tin borofluoride and 1.0 mol/l of thiourea at a temperature of 50° C. and pH=1.2 to form Sn metal coated layer of 0.3 μm in thickness on the surface of the roughened layer.

(6) The steps on and after the item (5) of Example 1 are carried out to produce a multilayer printed wiring board having solder bumps.

With respect to the multilayer printed wiring boards produced in Example 1, Example 2 and Comparative Example 1, the heat cycle test of –55~125° C. is repeated 1000 times to observe the presence or absence of crack in the inter-laminar resin insulating layer by means of an optical microscope. As a result, the occurrence of crack starting from a portion crossing the side face and the upper surface of the inner conductor circuit pattern is not observed in Example 1 and Example 2 because there is no difference of the roughened form between the side face and the upper surface of the inner conductor circuit pattern, while in Comparative Example 1 the occurrence of crack is observed. Furthermore, Example 1 has no problem in the mounting property of electronic parts.

EXAMPLE 3

A. Preparation of Adhesive for Electroless Plating as Upper Layer

①. 35 parts by weight of a resin solution of 25% acrylate of cresol novolac type epoxy resin (made by Nippon Kayaku Co., Ltd., molecular weight: 2500) dissolved at a concentration of 80 wt % in DMDG is mixed with 3.15 parts by weight of a photosensitive monomer (made by Toa Gosei Co., Ltd., Aronix M315), 0.5 part by weight of an anti-foaming agent (made by Sannopuco, S-65) and 3.6 parts by weight of NMP with stirring.

②. 12 parts by weight of polyether sulphone (PES) is mixed with 7.2 parts by weight of epoxy resin particles (made by Sanyo Kasei Co., Ltd., Polymerpol) having an average particle size of 1.0 μm and 3.09 parts by weight of the resin particles having an average particle size of 0.5 μm, and further added with 30 parts by weight of NMP, which are mixed in a bead mill with stirring.

③. 2 parts by weight of an imidazole curing agent (made by Shikoku Kasei Co., Ltd., 2E4MZ-CN) is mixed with 2 parts by weight of a photoinitiator (made by Ciba Geigy, Irgaqua I-907), 0.2 part by weight of a photosensitizer (made by Nippon Kayaku Co., Ltd., DETX-S) and 1.5 parts by weight of NMP with stirring.

They are mixed to prepare an adhesive for electroless plating used as an upper layer side adhesive layer constituting the interlaminar resin insulating layer of two-layer structure.

B. Preparation of Interlaminar Resin Insulating Agent as Lower Layer

①. 35 parts by weight of a resin solution of 25% acrylate of cresol novolac type epoxy resin (made by Nippon Kayaku Co., Ltd., molecular weight: 2500) dissolved at a concentration of 80 wt % in DMDG is mixed with 4 parts by weight of a photosensitive monomer (made by Toa Gosei Co., Ltd., Aronix M315), 0.5 part by weight of an anti-foaming agent (made by Sannopuco, S-65) and 3.6 parts by weight of NMP with stirring.

②. 12 parts by weight of polyether sulphone (PES) is mixed with 14.49 parts by weight of epoxy resin particles (made by Sanyo Kasei Co., Ltd., Polymerpol) having an average particle size of 0.5 μm, and further added with 30 parts by weight of NMP, which are mixed in a bead mill with stirring.

③. 2 parts by weight of an imidazole curing agent (made by Shikoku Kasei Co., Ltd., 2E4MZ-CN) is mixed with 2 parts by weight of a photoinitiator (made by Ciba Geigy, Irgaqua I-907), 0.2 part by weight of a photosensitizer (made by Nippon Kayaku Co., Ltd., DETX-S) and 1.5 parts by weight of NMP with stirring.

They are mixed to prepare a resin composition used as a lower layer side adhesive layer constituting the interlaminar resin insulating layer of two-layer structure.

C. Preparation of Resin Composition for Filling in Through-hole 3.5 parts by weight of cresol novolac type epoxy resin (made by Yuka Shell Co., Ltd., Epikote 152), 14.1 parts by weight of bisphenol F-type epoxy resin (made by Yuka Shell Co., Ltd., Epikote 807), 1.0 part by weight of silica ultra-fine particles (Aerosil R202) having an average particle size of 14 nm, 1.2 parts by weight of an imidazole curing agent (made by Shikoku Kasei Co., Ltd., 2E4MZ-CN) and 100 parts by weight of copper powder having an average particle size of 15 μm are kneaded through three rolls to prepare a viscosity of the mixture to 200~300 Pa·s at 22±1° C., whereby there is prepared a resin composition for the filling of the through-hole (resin filler) 5.

Figure 26:
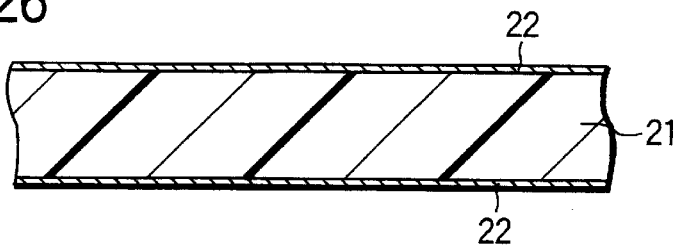
FIG. 26 to FIG. 42 are diagrammatic views illustrating steps of producing a third example of the printed wiring board according to the invention.

D. Production Method of Printed Wiring Board (1) There is provided a copper clad laminate formed by laminating copper foils 22 of 18 μm on both surfaces of a substrate 21 made of glass epoxy resin or BT (bismaleimide triazine) resin having a thickness of 1 mm as a starting material (see FIG. 26). At first, the copper clad laminate is drilled. Then, is added with palladium-tin colloid and subjected to an electroless plating under the following composition to form an electroless plated film of 2 μm on the full surface of the substrate.

| [Aqueous electroless plating solution] | |
| --- | --- |
| EDTA | 150 g/l |
| Copper sulfate | 20 g/l |
| HCHO | 30 ml/l |
| NaOH | 40 g/l |
| α,α'-bipyridyl | 80 mg/l |
| PEG | 0.1 g/l |

Electroless Plating Conditions liquid temperature of 70° C., 30 minutes

Figure 27:
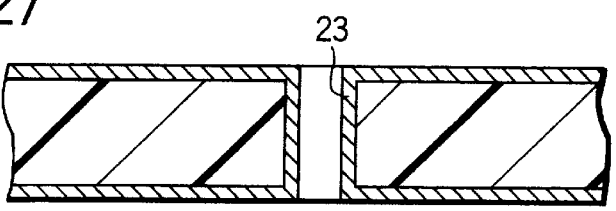

Further, the substrate is subjected to an electrolytic copper plating under the following conditions to form an electrolytic plated copper film having a thickness of 15 μm (see FIG. 27).

| [Aqueous electrolytic plating solution] | |
| --- | --- |
| Sulfuric acid | 180 g/l |
| Copper sulfate | 80 g/l |
| Additive (made by Atotec Japan, Co., Ltd. trade name: Kaparasid GL) | 1 ml/l |
| [Electrolytic plating conditions] | |
| Current density | 1 A/dm$^2$ |
| Time | 30 minutes |
| Temperature | room temperature |

Figure 28:
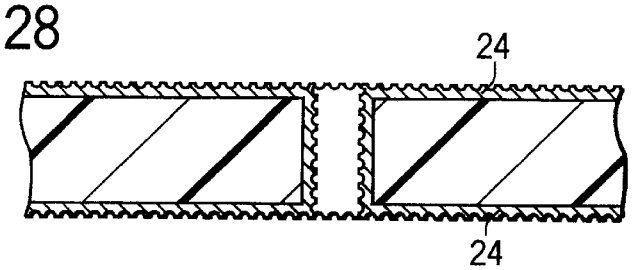

(2) The substrate provided over the full surface with a conductor consisting of the electroless copper plated film and the electrolytic plated film (including the through-hole 23) is washed with water, dried and subjected to oxidation-reduction treatment using an aqueous solution of NaOH (20 g/l), NaClO$_2$ (50 g/l) and Na$_3$PO$_4$ (15.0 g/l) as an oxidation bath and an aqueous solution of NaOH (2.7 g/l) and NaBH$_4$ (1.0 g/l) as a reduction bath to form a roughened layer 24 over the full surface of the conductor including the through-hole 23 (see FIG. 28).

Figure 29:
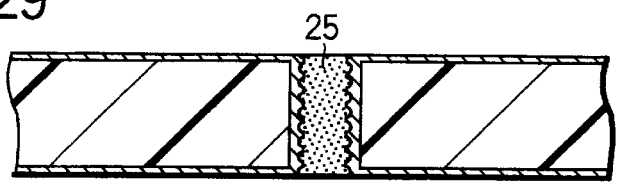

(3) The resin filler 25 prepared in the item C is filled in the through-hole 23 by screen printing, dried and cured. Then, the filler 25 protruded from the roughened layer 24 on the upper surface of the conductor and the through-hole 23 is removed by belt sander polishing with a #600 belt polishing paper (made by Sankyo Rikagaku Co., Ltd.) and then subjected to buffing for removing flaws due the belt sander polishing to flatten the surface of the substrate (see FIG. 29).

Figure 30:
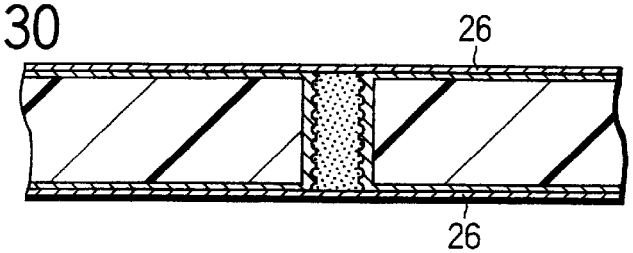

(4) A palladium catalyst (made by Atotec) is applied onto the surface of the substrate flattened in the above item (3), which is subjected to an electroless copper plating according to usual manner to form an electroless copper plated film 26 having a thickness of 0.6 μm (see FIG. 30).

(5) Then, it is subjected to an electrolytic copper plating under the following conditions to form an electrolytic copper plated film 27 having a thickness of 15 μm, whereby there are formed portions 29, 30 of conductor layer (cover plated layer) thickening portions of the inner conductor circuit patterns and directly covering the filler 25 filled in the through-hole 23.

| [Aqueous electrolytic plating solution] | |
|---|---|
| Sulfuric acid | 180 g/l |
| Copper sulfate | 80 g/l |
| Additive (made by Atotec Japan, Co., Ltd. trade name: Kaparasid GL) | 1 ml/l |
| [Electrolytic plating conditions] | |
| Current density | 1 A/dm$^2$ |
| Time | 30 minutes |
| Temperature | room temperature |

Figure 31:
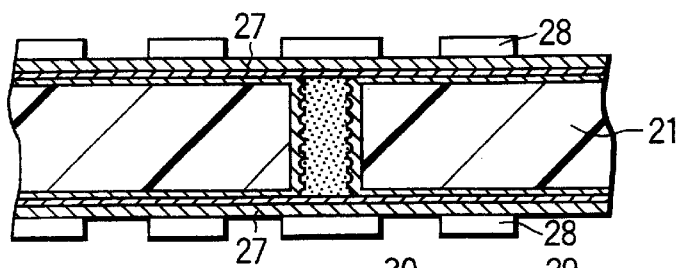

(6) Commercially available photosensitive dry films are attached to both surfaces of the substrate formed with the portions of the inner conductor circuit patterns 29 and the conductor layer 30 and a mask is placed thereonto, exposed to a light at 100 mJ/cm$^2$ and developed with 0.8% sodium carbonate to form an etched resist 28 having a thickness of 15 µm (see FIG. 31).

Figure 32:
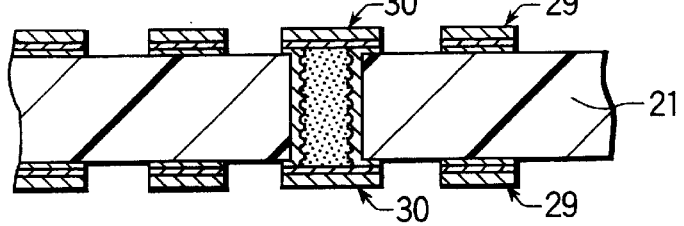

(7) Then, the plated film portions not forming the etched resist 28 are dissolved and removed by etching with a mixed solution of sulfuric acid and hydrogen peroxide, and further the etched resist 28 is peeled and removed with an aqueous solution of 5% KOH to form isolated inner conductor circuit patterns 29 and the conductor layer (cover plated layer) 30 covering the filler 25 (see FIG. 32).

Figure 33:
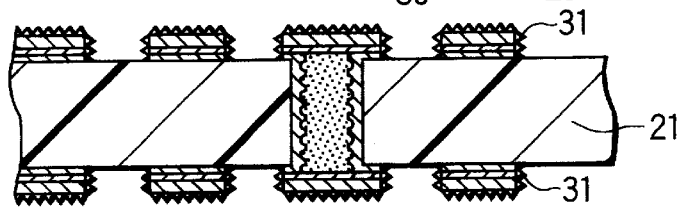

(8) Next, a roughened layer 31 of copper-nickel-phosphorus alloy having a thickness of 2.5 µm (uneven layer) is formed over full surface including side faces of the inner conductor circuit pattern 29 and conductor layer 30 (cover plated layer) covering the filler 25 and further Sn layer having a thickness of 0.3 µm is formed on the surface of the roughened layer 31 (see FIG. 33, Sn layer is not shown).

The formation method is as follows. That is, the substrate is acidically degreased, soft-etched, treated with a catalyst solution made of palladium chloride and organic acid to gibe a Pd catalyst. After the catalyst is activated, it is subjected to a plating in an electroless plating bath comprising an aqueous solution of 8 g/l of copper sulfate, 0.6 g/l of nickel sulfate, 15 g/l of citric acid, 29 g/l of sodium hypophosphite, 31 g/l of boric acid and 0.1 g/l of a surfactant (made by Nisshin Kagaku Kogyo Co., Ltd., Surfynol 465) and having pH=9 to form the roughened layer 31 of copper-nickel-phosphorus alloy on the conductor circuit patterns 29 and the conductor layer 30 covering the filler 25. Then, it is subjected to Cu—Sn substitution reaction using 0.1 mol/l of tin borofluoride and 1.0 mol/l of thiourea at a temperature of 50° C. and pH=1.2 to from Sn layer having a thickness of 0.3 am on the surface of the roughened layer 31 (Sn layer is not shown).

Figure 34:
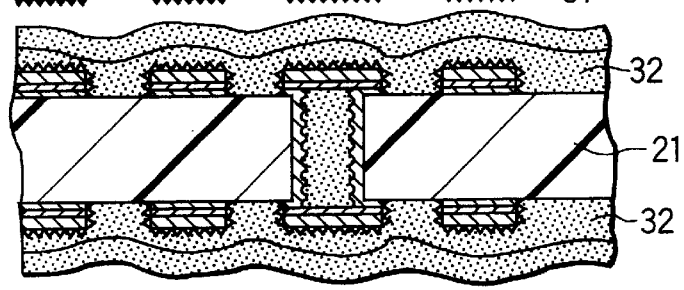

(9) The resin insulating agent of the item B (viscosity 15 Pa·s) is applied to both surfaces of the substrate, left to stand at a horizontal state for 20 minutes and dried at 60° C. for 30 minutes to form a resin insulating agent layer. Further, the adhesive for electroless plating of the item A (viscosity 8 Pa·s) is applied to the insulating agent layer and dried at 55° C. for 40 minutes to form an adhesive layer, whereby an interlaminar resin insulating layer 32 is formed (see FIG. 34). In this case, the surface of the inter-laminar resin insulating layer 32 is not flat due to the irregularities between the conductors.

Figure 35:
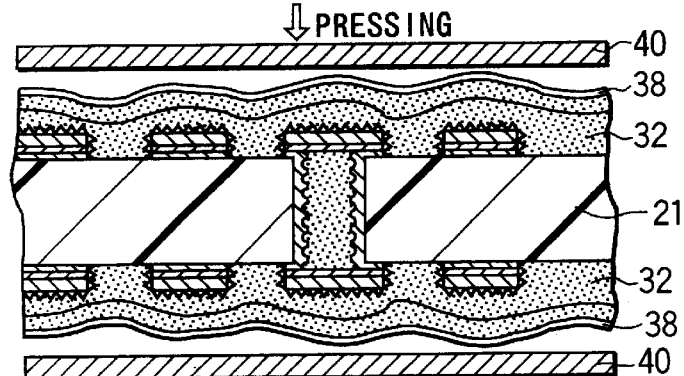

(10) After a polyethylene terephthalate film 38 trans-parent film) is adhered to the surface of the inter-laminar resin insulating layer 32 formed in the item (9), it is sandwiched between stainless plated 40 and hot-pressed under a pressure of 20 kgf/cm$^2$ for 20 minutes while heating at 65° C. in a heating furnace (see FIG. 35). The surface of the interlaminar resin insulating layer 32 is flattened by the hot pressing.

Figure 36:
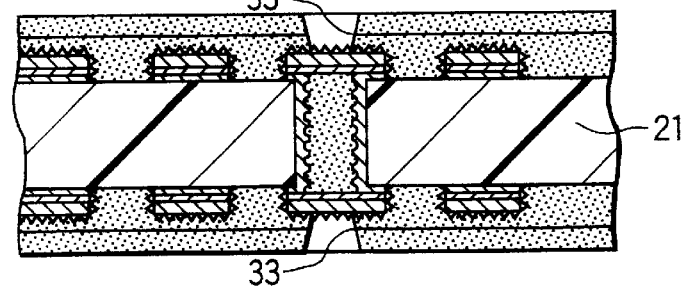

(11) A photomask film depicted with black circles of 85 µmΦ is adhered to both surfaces of the substrate flattened in the item (10) and exposed to a super-high pressure mercury lamp at 500 mJ/cm$^2$. It is spray-developed with DMDG solution to form openings for via-holes of 85 µm in the interlaminar resin insulating layer 32. Further, the substrate is exposed to a super-high pressure mercury lamp at 3000 mJ/cm$^2$ and subjected to a heating treatment at 100° C. for 1 hour and 150° C. for 5 hours to form the inter-laminar resin insulating layer 32 of 35 µm in thickness having openings (openings 33 for the formation of via-hole) with an excellent size accuracy corresponding to the photomask film (see FIG. 36). Moreover, tin plated layer is partly exposed in the opening for the via-hole.

(12) The substrate formed with the openings for the formation of via-hole is immersed in an aqueous solution of 800 g/l of chromic acid at 70° C. for 19 minutes to dissolve and remove the epoxy resin particles existing on the surface of the adhesive layer in the interlaminar resin insulating layer 32, whereby the surface of the inter-laminar resin insulating layer 32 is roughened (depth: 3 µm), and thereafter immersed in a neutral solution (made by Shipley) and washed with water.

Furthermore, the surface of the roughened substrate is applied with a palladium catalyst (made by Atotec), whereby a catalyst nucleus is given to the surface of the inter-laminar resin insulating layer 32 and the inner wall face of the opening 33 for the via-hole.

Figure 37:
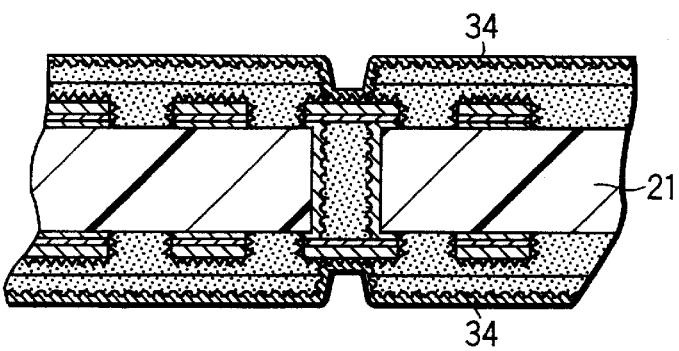

(13) The substrate is immersed in an aqueous electroless copper plating solution having the following composition to from an electroless copper plated film 34 having a thickness of 0.6 µm on the whole of the roughened surface (see FIG. 37). In this case, the irregularities are observed on the surface of the electroless plated film because the plated film is thin.

| [Aqueous electroless plating solution] | |
|---|---|
| EDTA | 150 g/l |
| Copper sulfate | 20 g/l |
| HCHO | 30 ml/l |
| NaOH | 40 g/l |
| α,α'-bipyridyl | 80 mg/l |
| PEG | 0.1 g/l |

Electroless Plating Conditions liquid temperature of 70° C., 30 minutes

Figure 38:
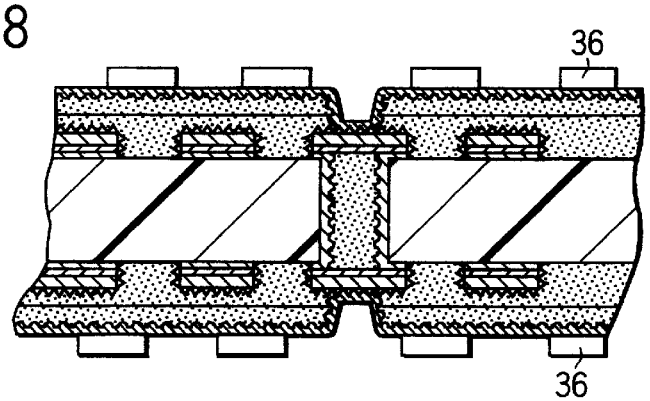

(14) A commercially available photosensitive dry film is adhered onto the electroless plated film 34 formed in the item (13) and a mask is placed thereonto, which is exposed to a light at 100 mJ/cm$^2$ and developed with 0.8% sodium carbonate to form a plated resist 16 having a thickness of 15 µm (see FIG. 38).

Figure 39:
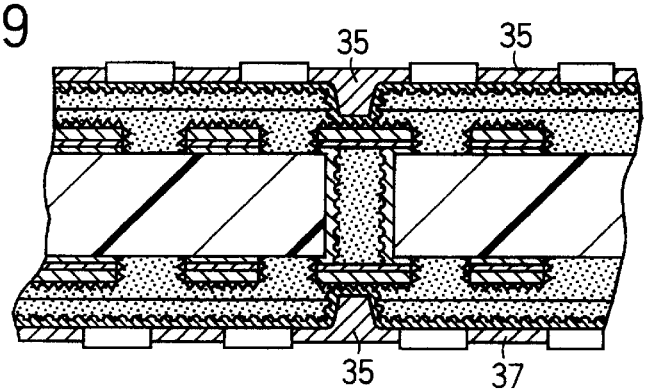

(15) Then, the substrate is washed with water of 50° C., degreased, washed with water of 25° C., further washed with sulfuric acid and subjected to an electrolytic copper plating under the following conditions to form an electrolytic plated film 35 having a thickness of 15 µm (see FIG. 39).

| [Aqueous electrolytic plating solution] | |
|---|---|
| Sulfuric acid | 180 g/l |
| Copper sulfate | 80 g/l |
| Additive (made by Atotec Japan, Co., Ltd. trade name: Kaparasid GL) | 1 ml/l |
| [Electrolytic plating conditions] | |
| Current density | 1 A/dm$^2$ |
| Time | 30 minutes |
| Temperature | room temperature |

Figure 40:
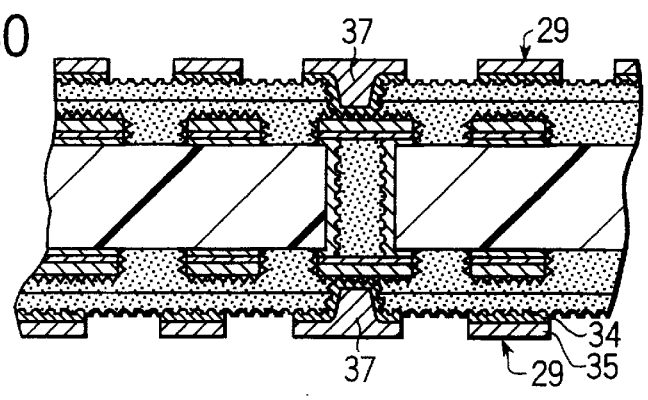

(16) After the plated resist 36 is peeled and removed with an aqueous solution of 5% KOH, the electroless plated film 35 beneath the plated resist 36 is dissolved and removed by etching with a mixed solution of sulfuric acid and hydrogen peroxide to form outer conductor circuit patterns 29 (including via-holes 37) of 18 μm comprised of the electroless copper plated film 34 and the electrolytic copper plated film 35 (see FIG. 40). Further, it is immersed in an aqueous solution of 800 g/l of chromic acid at 70° C. for 3 minutes to etch the surface of the adhesive layer for electroless plating between the conductor circuit patterns located in portions not forming the outer conductor circuit pattern by 1 μm, whereby the palladium catalyst reaming on the surface is removed.

(17) The substrate provided with the outer conductor circuit patterns 29 is immersed in an electroless plating solution comprising 8 g/l of copper sulfate, 0.6 g/l of nickel sulfate, 15 g/l of citric acid, 29 g/l of sodium hypophosphite, 31 g/l of boric acid and 0.1 g/l of a surfactant (made by Nisshin Kagaku Kogyo Co., Ltd., Surfynol 465) and having pH=9 to form a roughened layer 31 made of copper-nickel-phosphorus and having a thickness of 3 μm on the surface of the outer conductor circuit pattern 29. In this case, the resulting roughened layer 31 has a composition ratio of Cu: 98 mol %, Ni: 1.5 mol % and P: 0.5 mol % as analyzed by EPMA (fluorescent X-ray analyzing device).

Figure 41:
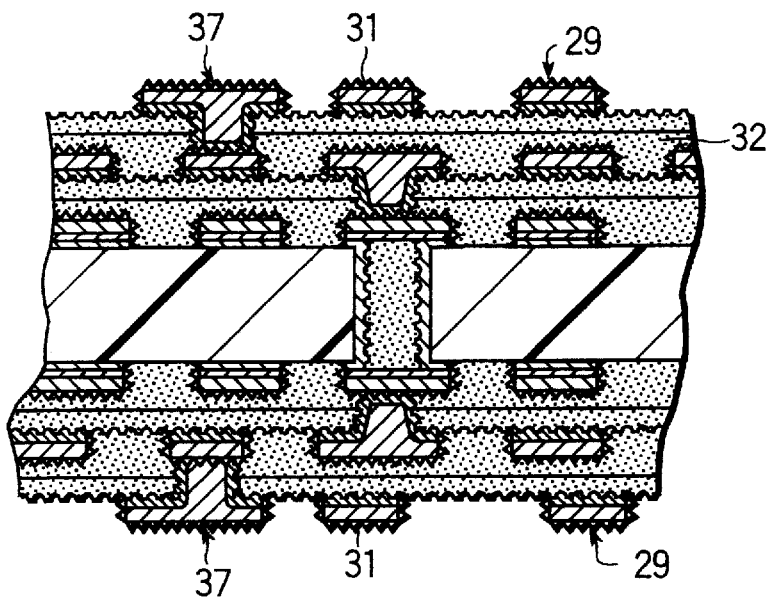

(18) The steps (9)~(17) are repeated to further form outer-layer conductor circuit patterns, whereby a multilayer wiring board. However, Sn-substitution is not conducted (see FIG. 41).

(19) On the other hand, a solder resist composition is obtained by mixing 46.67 parts by weight of a photosensitized oligomer (molecular weight: 4000) acrylated with 50% of epoxy group in 60 wt % cresol novolac type epoxy resin (made by Nippon Kayaku Co., Ltd.) dissolved in DMDG, 15.0 parts by weight of 80 wt % bisphenol A-type epoxy resin (made by Yuka Shell Co., Ltd., Epikote 1001) dissolved in methyl ethyl ketone, 1.6 parts by weight of an imidazole curing agent (made by Shikoku Kasei Co., Ltd., 2E4MZ-CN), 3 parts by weight of polyvalent acrylic monomer (made by Nippon Kayaku Co., Ltd., R604) and 1.5 parts by weight of polyvalent acrylic monomer (made by Kyoeisha Kagaku Co., Ltd., DPE6A) as a photosensitive monomer and 0.71 part by weight of a dispersion anti-foaming agent (made by Sannopuco, S-65) and adding 2 parts by weight of benzophenone (made by Kanto Kagaku Co., Ltd.) as a photoinitiator and 0.2 part by weight of Michlers' ketone (made by Kanto Kagaku Co., Ltd.) as a photosensitizer.

(20) The solder resist composition is applied to both surfaces of the multilayer wiring board obtained in the item (18). Then, it is dried at 70° C. for 20 minutes and 70° C. for 30 minutes, and thereafter a soda lime glass substrate depicted with circle pattern corresponding to opening portions of the solder resist (mask pattern) with chromium layer is closed to the solder resist layer at a side facing the chromium layer, which is exposed to a ultraviolet ray at 1000 mJ/cm$^2$ and developed with DMDG. Further, it is subjected to a heating treatment under conditions of 80° C. for 1 hour, 100° C. for 1 hour, 120° C. for 1 hour and 150° C. for 3 hours to form a solder resist pattern layer 39 (thickness: 20 μm) opening the upper surface of the solder pad, the via-hole and land portion (opening diameter: 200 μm).

(21) Then, the substrate formed with the solder resist pattern layer 39 is immersed in an electroless nickel plating solution comprising an aqueous solution of 30 g/l of nickel chloride, 10 g/l of sodium hypophosphite and 10 g/l of sodium citrate and having pH=5 for 20 minutes to form a nickel plated layer 41 having a thickness of 5 μm on the opening portion. Further, the substrate is immersed in an electroless gold plating solution comprising an aqueous solution of 2 g/l of potassium gold cyanide, 75 g/l of ammonium chloride, 50 g/l of sodium citrate and 10 g/l of sodium hypophosphite at 93° C. for 23 seconds to form a gold plated layer 42 having a thickness of 0.03 μm on the nickel plated layer 41.

Figure 42:
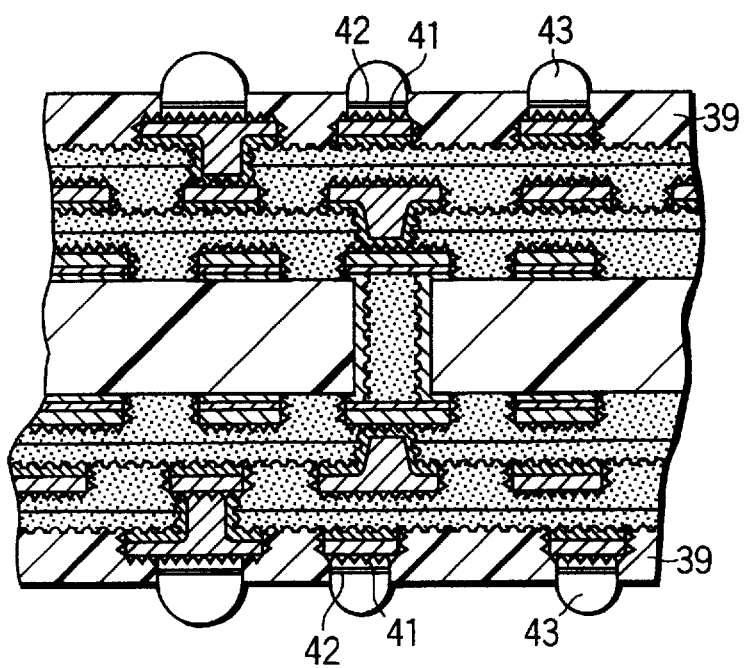

(22) A solder paste is printed on the opening portion of the solder resist pattern layer 39 and reflowed at 200° C. to form a solder bump (solder body) 43, whereby there is produced a multilayer printed wiring board having solder bumps 43 (see FIG. 42).

EXAMPLE 4

(1) The treatment is carried out according to the same steps as in the items (1)~(7) of Example 3.

(2) To the full surface including side faces of the inner conductor circuit patterns 29 and side faces of the conductor layer 30 covering the filler 25 is sprayed an etching solution comprising 10 parts by weight of imidazole copper (II) complex, 7 parts by weight of glycolic acid and 5 parts by weight of potassium chloride, i.e. "Mechetchbond", trade name of Mech Corporation, which is transferred to conduct the etching, whereby a roughened layer is formed. The resulting roughened surface has a height of 3 μm. (Tin layer is not formed.)

(3) The treatment is carried out according to the same steps as in the items (9)~(16) of Example 3.

(4) To the full surface including side faces of the outer conductor circuit patterns 29 and side face of the conductor layer 30 covering the filler 25 is sprayed an etching solution comprising 10 parts by weight of imidazole copper (II) complex, 7 parts by weight of glycolic acid and 5 parts by weight of potassium chloride, i.e. "Mechetchbond", trade name of Mech Corporation, which is transferred to conduct the etching, whereby a roughened layer is formed. The resulting roughened surface has a height of 3 μm. (Tin layer is not formed.)

(5) The treatment is carried out according to the same steps as in the items (18)~(22) of Example 3 to produce a multilayer printed wiring board.

Comparative Example 2

(1) The treatment is carried out according to the same steps as in the items (1)~(8) of Example 3.

(2) Preparation of resin filler

①. 100 parts by weight of bisphenol F-type epoxy monomer (made by Yuka Shell Co., Ltd., molecular weight: 310, YL983U), 170 parts by weight of SiO$_2$ spherical particles (made by Adomatec, CRS 1101-CE, maximum particle size is not more than thickness (15 μm) of innerlayer copper pattern mentioned later) coated at its surface with a silane coupling agent and having an average particle size of 1.6 μm and 1.5 parts by weight of a leveling agent (made by Sannopuco, Prenol S4) are kneaded through three rolls to adjust a viscosity of the mixture to 45,000~49,000 cps at 23±1° C.

②. 6.5 parts by weight of an imidazole curing agent (made by Shikoku Kasei Co., Ltd., 2E4MZ-CN)

They are mixed to prepare a resin filler.

(3) The resin filler is applied onto both surfaces of the substrate by means of a roll coater to fill between the conductor circuit patterns and then cured by heating at 100° C. for 1 hour, 120° C. for 3 hours, 150° C. for 1 hour and 180° C. for 7 hours.

(4) A surface of the substrate treated in the item (3) is polished by a belt sander polishing using #600 bent polishing paper (made by Sankyo Rikagaku Co., Ltd.) so as not to remain the resin filler on the surface of the innerlayer copper pattern or the land surface of the through-hole and then subjected to buffing for removing flaws based on the belt sander polishing. Such a series of polishing is applied to the other surface of the substrate.

However, the cover plated layer is peeled off in this polishing step. In this connection, the high densification of interconnecting and through-hole can be realized without damaging the cover plated layer by the method of Example 3 according to the invention.

Comparative Example 3

(1) There is provided a copper clad laminate formed by laminating copper foils of 18 μm onto both surfaces of a substrate made of glass epoxy resin or BT (bismaleimide triazine) resin having a thickness of 1 mm as a starting material. At first, the copper clad laminate is drilled and a plating resist is formed and subjected to an electroless plating treatment to form a through-hole, and further the copper foil is etched in form of a pattern according to usual manner to form innerlayer copper patterns on both surfaces of the substrate.

(2) The substrate formed with the innerlayer copper patterns is washed with water, dried and treated with an aqueous solution of NaOH (10 g/l), NaCl$_2$ (40 g/l) and Na$_3$PO$_4$ (6 g/l) as an oxidation bath and an aqueous solution of NaOH (10 g/l) and NaBH$_4$ (6 g/l) as a reduction bath to form a roughened layer over a full surface of the conductor circuit patterns and the through-hole.

(3) Preparation of resin filler

①. 100 parts by weight of bisphenol F-type epoxy monomer (made by Yuka Shell Co., Ltd., molecular weight: 310, L983U), 170 parts by weight of SiO$_2$ spherical particles (made by Adomatec, CRS 1101-CE, maximum particle size is not more than thickness (15 μm) of innerlayer copper pattern mentioned later) coated at its surface with a silane coupling agent and having an average particle size of 1.6 μm and 1.5 parts by weight of a leveling agent (made by Sannopuco, Prenol S4) are kneaded through three rolls to adjust a viscosity of the mixture to 45,000~49,000 cps at 23±1° C.

②. 6.5 parts by weight of an imidazole curing agent (made by Shikoku Kasei Co., Ltd., 2E4MZ-CN)

They are mixed to prepare a resin filler.

(4) This resin filler is printed onto both surfaces of the substrate by means of a roll coater to fill between the conductor circuit patterns or in the through-holes and cured by heating at 100° C. for 1 hour, 120° C. for 3 hours, 150° C. for 1 hour and 180° C. for 7 hours. That is, the resin filler is filled between the innerlayer copper patterns or in the through-hole at this step.

(5) A surface of the substrate treated in the item (4) is polished by a belt sander polishing using #600 bent polishing paper (made by Sankyo Rikagaku Co., Ltd.) so as not to remain the resin filler on the surface of the innerlayer copper pattern or the land surface of the through-hole and then subjected to buffing for removing flaws based on the belt sander polishing. Such a series of polishing is applied to the other surface of the substrate.

Thus, the surface layer portion of the resin filler filled in the through-hole and the like and the roughened layer on the upper surface of the innerlayer conductor circuit pattern are removed to flatten both surfaces of the substrate, whereby there is obtained a wiring substrate herein the resin filler is strongly adhered to the side ace of the conductor circuit pattern through the roughened layer and the inner wall face of the through-hole is strongly adhered to the resin filler through the roughened layer. That is, the surface of the resin filler and the surface of the innerlayer copper pattern become the same plane at this step. Here, the curing resin filled has a Tg point of 155.6° C. and a linear thermal expansion coefficient of 44.5×10$^{-5}$/° C.

(6) Further, copper-nickel-phosphorus alloy coated layer of 5 μm in thickness, copper-nickel-phosphorus needle-10 shaped alloy roughened layer of 2 μm in thickness are formed on the upper surfaces of the exposed conductor circuit pattern and through-hole land and Sn metal coated layer of 0.3 μm in thickness is formed on the surface of the roughened layer.

The formation of these layers are as follows. That is, the substrate is acidically degreased, soft-etched and treated with a catalyst solution of palladium chloride and organic acid to form Pd catalyst. After the catalyst is activated, the substrate is immersed in an electroless copper plating bath comprising an aqueous solution of 8 g/l of copper sulfate, 0.6 g/l of nickel sulfate, 15 g/l of citric acid, 29 g/l of sodium hypophosphite, 31 g/l of boric acid and 0.1 g/l of a surfactant (made by Nisshin Kagaku Kogyo Co., Ltd. Surfynol 104) and having pH=9 while vibrating the substrate in a longitudinal direction every 4 seconds to precipitate the plated layer. After 3 minutes, air is bubbled to first precipitate copper-nickel-phosphorus non-needle coated layer on the surface of the surfaces of the copper conductor circuit pattern and the through-hole and then precipitate copper-nickel-phosphorus needle-shaped alloy to thereby form roughened layers.

Further, it is subjected to a heating treatment at 100° C. for 30 minutes, 120° C. for 30 minutes and 150° C. for 2 hours and treated with an aqueous solution of 10 vol % of sulfuric acid and an aqueous solution of 0.2 mol/l of borofluoric acid and subjected to Cu—Sn substitution reaction with an aqueous solution of 0.1 mol/l of tin borofluoride and 1.0 mol/l of thiourea at a temperature of 50° C. and pH=1.2 to form Sn metal coated layer of 0.3 μm in thickness on the surface of the roughened layer.

(7) The same steps as in the items (9)~(22) of Example 3 are carried out to produce a multilayer printed wiring board having solder bumps.

With respect to the multilayer printed wiring boards produced in Examples 3, 4 and Comparative Examples 2 and 3, the heat cycle test of −55~125° C. is repeated 1000 times to observe the presence or absence of crack in the interlaminar resin insulating layer by means of an optical microscope. And also, the mounting property of electronic part is evaluated.

As a result, there is no occurrence of crack in Examples 3 and 4, while the occurrence of crack is observed in Comparative Examples 2 and 3. Therefore, the printed wiring boards according to the invention are excellent in the crack resistance under heat cycle condition and have no problem in the mounting property of electronic parts.

INDUSTRIAL APPLICABILITY

As mentioned above, according to the invention, the occurrence of crack due to the difference of roughened form between surface and side face of the conductor can effectively be prevented at the boundary face between the conductor circuit pattern and the interlaminar resin insulating layer, and also the multilayer printed wiring boards capable of realizing high densification of interconnecting and through-hole can be produced without damaging the cover plated layer.

What is claimed is:

1. A multilayer printed wiring board having a structure that outer conductor circuit patterns are formed on a core substrate having inner conductor circuit patterns formed thereon through interlaminar resin insulating layers, and through-holes are formed in the substrate for electrically connecting the inner conductor circuit patterns to each other, and a filler is filled in the through-hole, and wherein the interlaminar resin insulating layer formed on the substrate is flat and a same kind of roughened layer is formed on the inner conductor circuit pattern on the substrate over a fill surface including a side surface thereof.

2. A multilayer printed wiring board having a structure that outer conductor circuit patterns are formed on a core substrate having inner conductor circuit patterns formed thereon through interlaminar resin insulating layers, and through-holes are formed for electrically connecting the inner conductor circuit patterns to each other in the substrate, and a filler is filled in the through-hole, a conductor layer covering an exposed surface of the filler from the through-hole is formed just above the through-hole directly covering an exposed surface of the filler, and a same kind of roughened layers are formed on the conductor layer and the inner conductor circuit pattern located at the same level as the conductor layer over a full surface including side surfaces thereof, and the interlaminar resin insulating layer is formed so as to cover the surfaces of these roughened layers and filled in recess portions between the conductor and inner conductor circuit pattern or between the inner conductor circuit patterns and flattened on its surface.

3. A method of producing a multilayer printed wiring board having a structure that outer conductor circuit patterns are formed on a core substrate having inner conductor circuit patterns formed thereon through interlaminar resin insulating layers, and through-holes are formed for electrically connecting the conductor circuit patterns to each other in the substrate, and a filler is filled in the through-hole, which comprises at least:

(a) forming through-holes on a substrate provided on each of both surfaces with a metal layer;

(b) roughening the surface of the metal layer and an inner wall face of the through-hole;

(c) filling a resin in the through-hole;

(d) flattening resin exposed from the through-hole and the roughened surface of the metal layer by polishing;

(e) etching the metal layer to form inner conductor circuit patterns to thereby form a core substrate;

(f) forming a same kind of roughened layers on a full surface of the inner conductor circuit patterns including side faces thereof; and (g) forming a resin insulating layer so as to cover the roughened layers and flattening the surface of the resin insulating layer by hot pressing to form an interlaminar resin insulating layer.

4. A method of producing a multilayer printed wiring board having a structure that outer conductor circuit patterns are formed on a core substrate having inner conductor circuit patterns formed thereon through interlaminar resin insulating layers, and through-holes are formed for electrically connecting the inner conductor circuit patterns to each other in the core substrate and a filler is filled in the through-hole, which comprises at least:

(a) forming through-holes in the core substrate;

(b) forming a roughened layer on an inner wall face of each through-hole;

(c) filling a filler in each through-hole;

(d) forming a conductor layer directly covering an exposed surface of the filler from each through-hole just above the through-hole;

(e) forming a same kind of roughened layers on a full surface of the inner conductor layer and the conductor circuit pattern located at the same level as the conductor layer including side surfaces thereof;

(f) forming a resin insulating layer so as to cover the roughened layers and flattening the surface of the resin insulating layer by hot pressing to form an interlaminar resin insulating layer; and (g) forming outer conductor circuit patterns on the interlaminar resin insulating layer.

5. The method of producing a multilayer printed wiring board according to claim 4, wherein the formation of the roughened layer at (b) is carried out by oxidation-reduction treatment.

6. The method of producing a multilayer printed wiring board according to claim 4, wherein when a photosensitive interlaminar resin insulating layer is formed at (f), a transparent film is adhered to the surface of the resin insulating layer prior to the hot pressing and then the surface of the resin insulating layer is flattened through the transparent film by hot pressing and cured by light exposure and thereafter the transparent film is removed to conduct a development treatment.

7. The method of producing a multilayer printed wiring board according to claim 4, wherein the hot pressing at (f) is carried out by pushing a metal plate or a metal roll while heating the resin insulating layer.

8. The method of producing a multilayer printed wiring board according to claim 4, wherein in (f), the hot pressing of the resin insulating layer composed mainly of epoxy resin is carried out under conditions that a temperature is 40~60° C., a pressure is 3.5~6.5 kgf/cm$^2$ and a pressing time is 30~90 seconds.

9. The method of producing a multilayer printed wiring board according to claim 4, wherein an opening is formed in a portion of the interlaminar resin insulating layer located just above each through-hole to form outer conductor circuit pattern and via-hole.

10. The method of producing a multilayer printed wiring board according to claim 4, wherein the filler comprises metal particles, a thermosetting or thermoplastic resin and a curing agent.

* * * * *

UNITED STATES PATENT AND TRADEMARK OFFICE
CERTIFICATE OF CORRECTION

PATENT NO.     : 6,512,186 B1
DATED          : January 28, 2003
INVENTOR(S)    : Y. Nishiwaki et al.

It is certified that error appears in the above-identified patent and that said Letters Patent is hereby corrected as shown below:

<u>Column 31,</u>
Line 25, "fill" should be -- full --.

Signed and Sealed this

Second Day of September, 2003

JAMES E. ROGAN
*Director of the United States Patent and Trademark Office*